United States Patent [19]

Shah et al.

[11] Patent Number: 5,065,208
[45] Date of Patent: Nov. 12, 1991

[54] INTEGRATED BIPOLAR AND CMOS TRANSISTOR WITH TITANIUM NITRIDE INTERCONNECTIONS

[75] Inventors: Rajiv R. Shah, Plano; Toan Tran, Dallas, both of Tex.

[73] Assignee: Texas Instruments Incorporated, Dallas, Tex.

[21] Appl. No.: 481,804

[22] Filed: Feb. 20, 1990

Related U.S. Application Data

[63] Continuation of Ser. No. 8,910, Jan. 30, 1987, abandoned.

[51] Int. Cl.$^5$ ............... H01L 29/72; H01L 27/04; H01L 29/04; H01L 23/48
[52] U.S. Cl. ........................... 357/34; 357/43; 357/48; 357/59; 357/71
[58] Field of Search ............ 357/34, 48, 49, 59, 357/71, 43

[56] References Cited

U.S. PATENT DOCUMENTS

| | | | |
|---|---|---|---|
| 4,481,706 | 11/1984 | Roche | 357/59 |
| 4,484,211 | 11/1984 | Takemoto et al. | 317/59 |
| 4,539,742 | 9/1985 | Kanzaki et al. | 357/59 |
| 4,583,106 | 4/1986 | Anantha et al. | 357/59 |
| 4,811,076 | 3/1989 | Tigelaar et al. | 357/51 |

FOREIGN PATENT DOCUMENTS 59-34660 2/1984 Japan ......................... 357/59

*Primary Examiner*—Rolf Hille
*Assistant Examiner*—Robert P. Limanek
*Attorney, Agent, or Firm*—Melvin Sharp; James T. Comfort; N. Rhys Merrett

[57] ABSTRACT

A process is disclosed with integrated steps for fabricating bipolar and CMOS transistors. Mask, patterning and implanting steps are highly integrated to reduce the fabrication complexity. The integrated steps include a split level polysilicon step wherein PMOS and NMOS gate conductors and a bipolar emitter structure is formed. The polysilicon is heavily doped which forms MOS transistor gate electrodes, and another high impurity concentration area which is later diffused into an underlying bipolar base region. Small area, high performance transistors can be fabricated with laterally extending contact strips. Alignment of electrode metallization patterns is thus less critical.

23 Claims, 12 Drawing Sheets

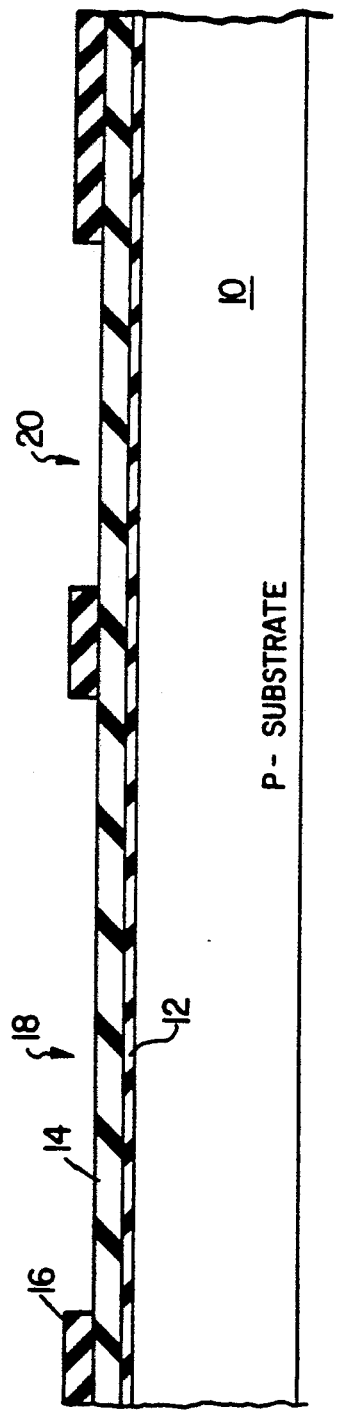
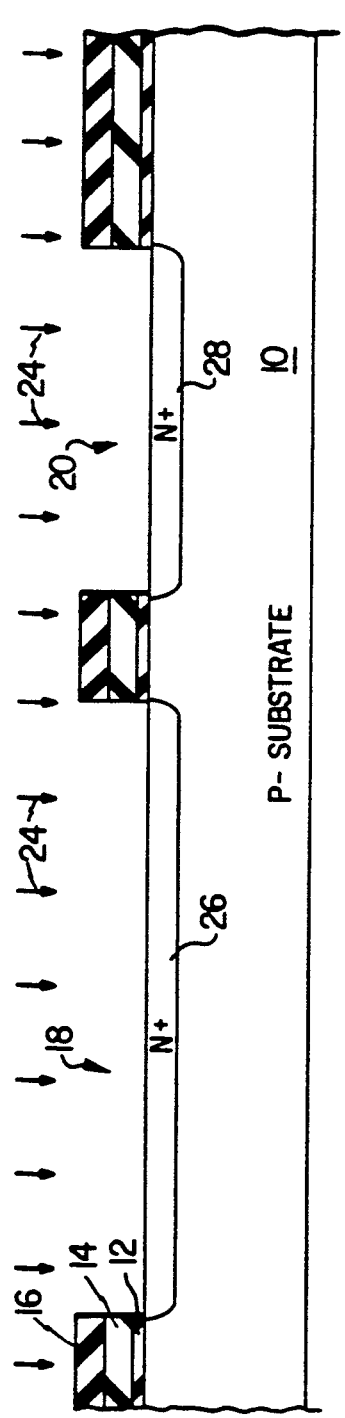
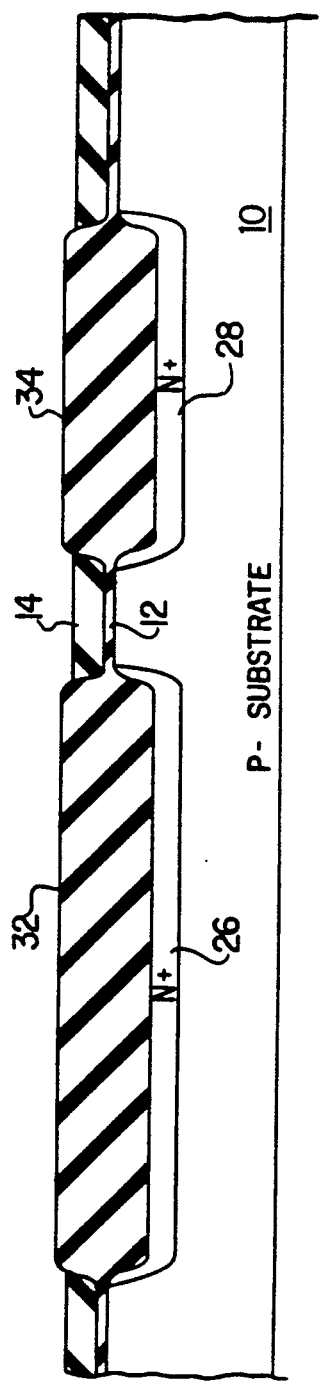

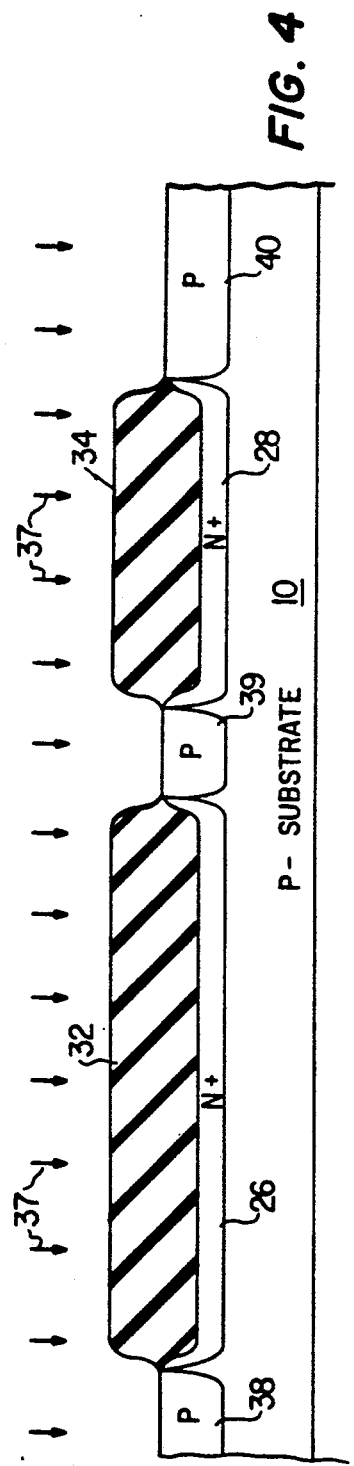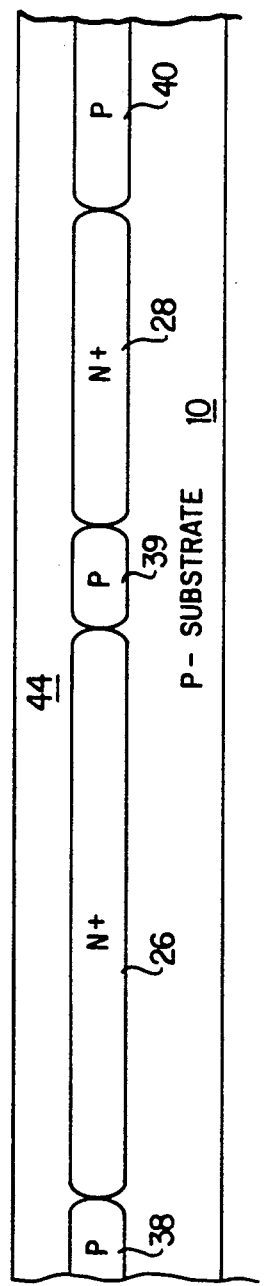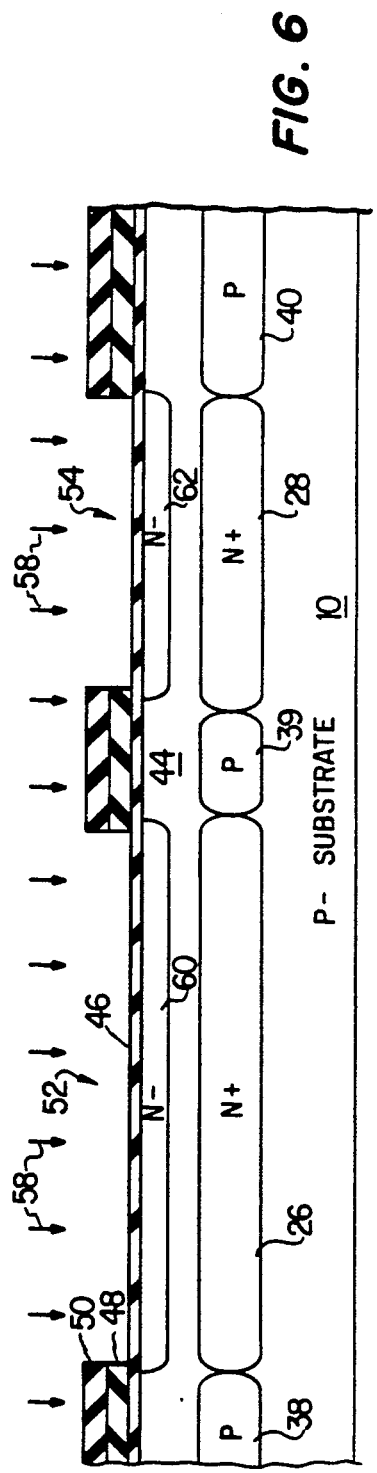

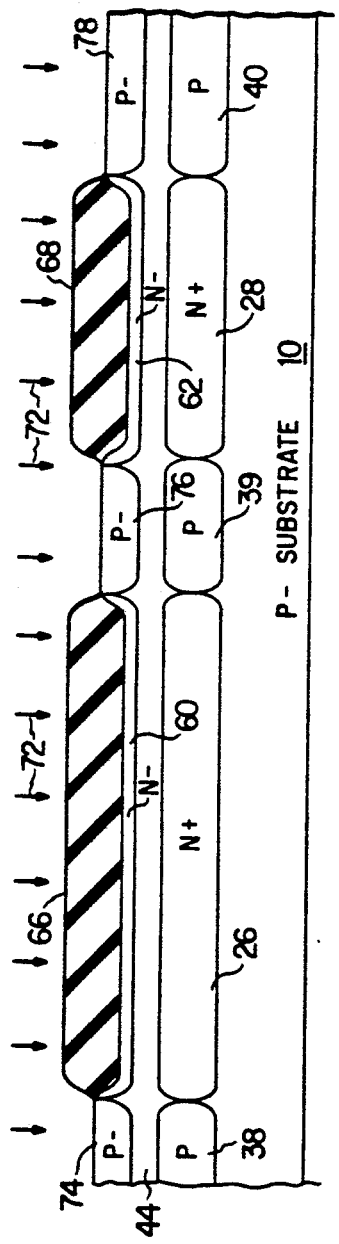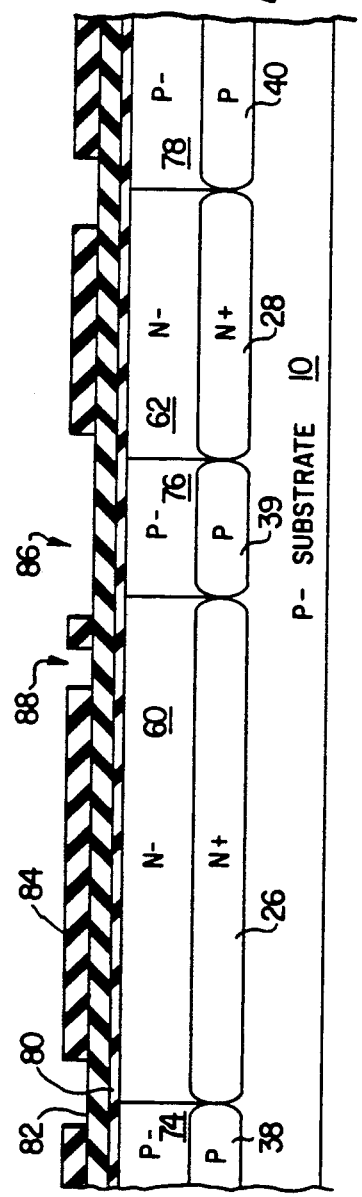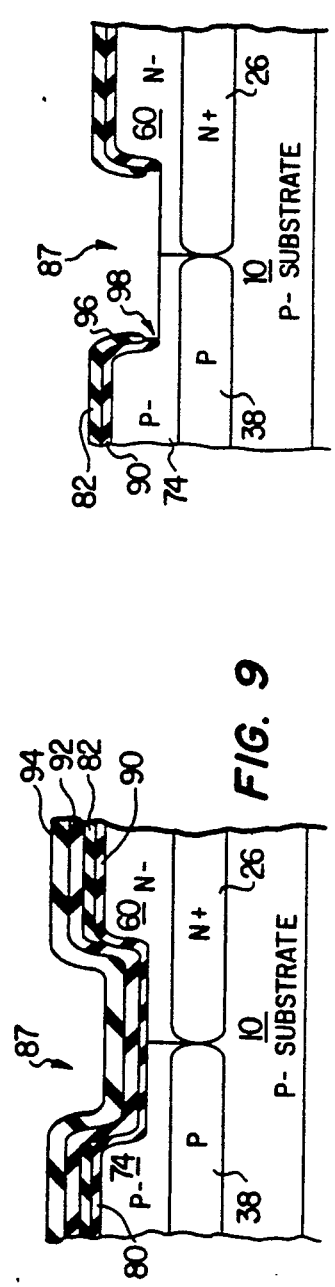

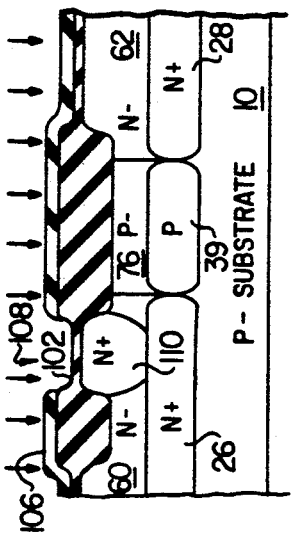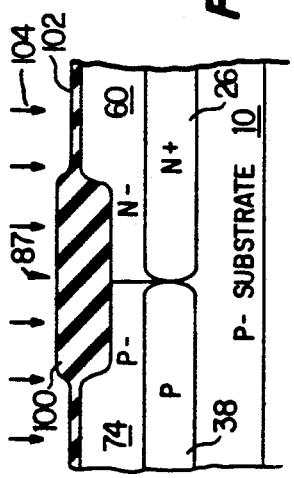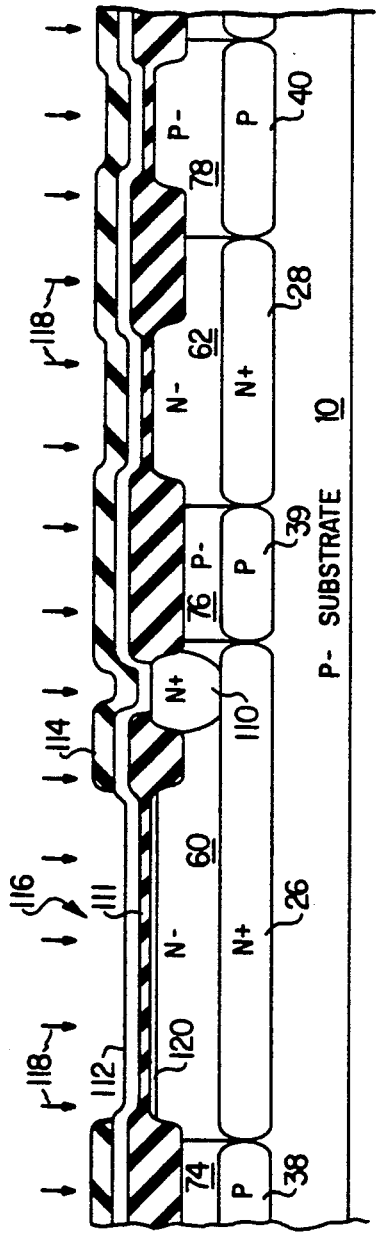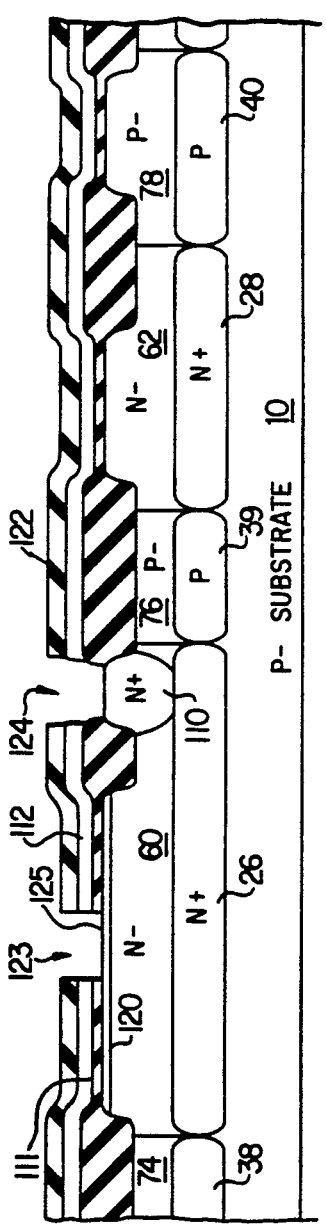

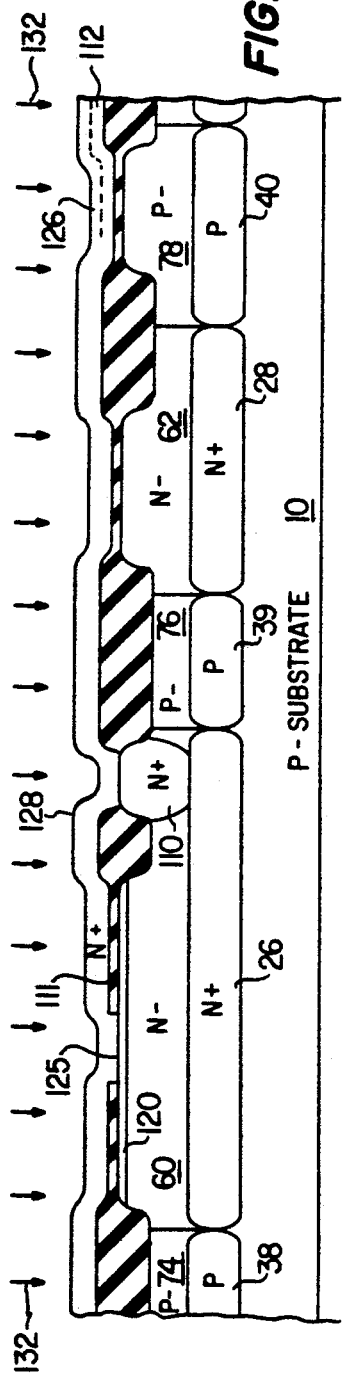
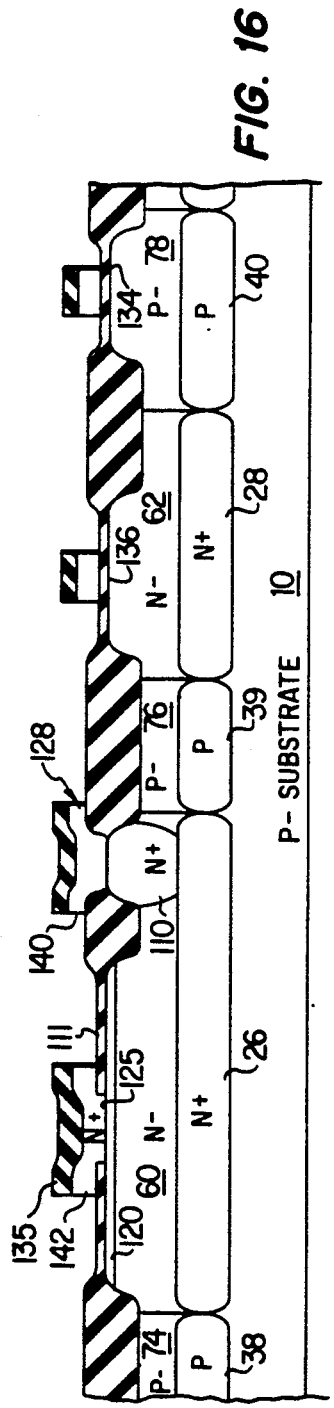
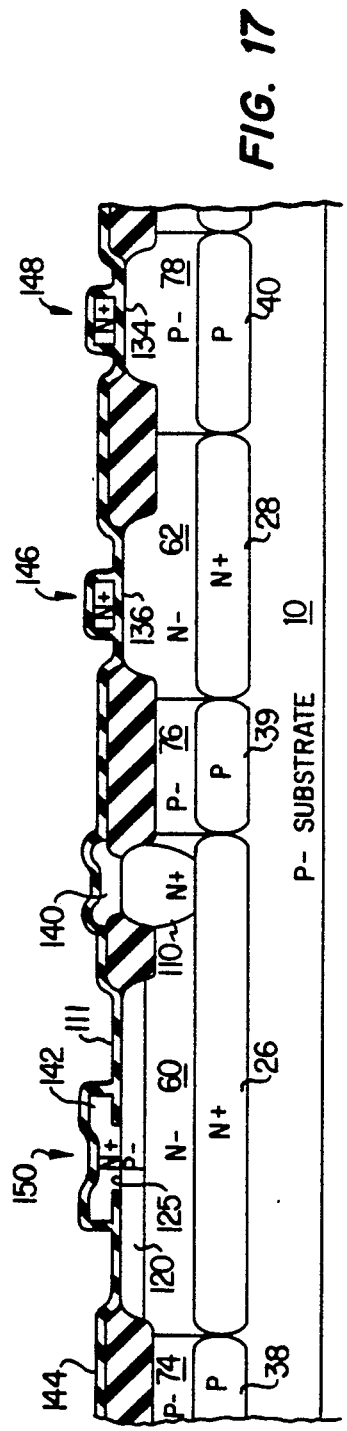

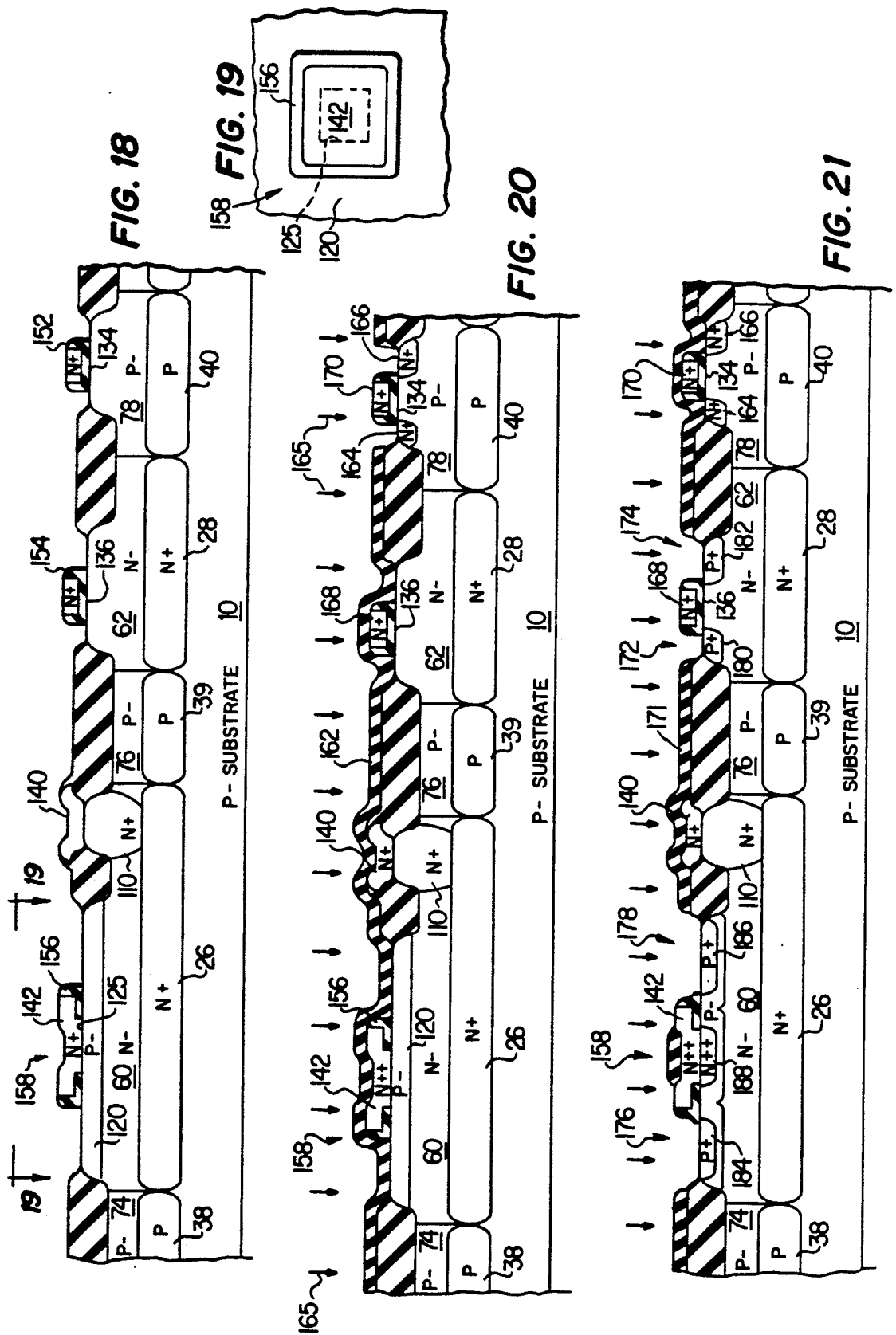

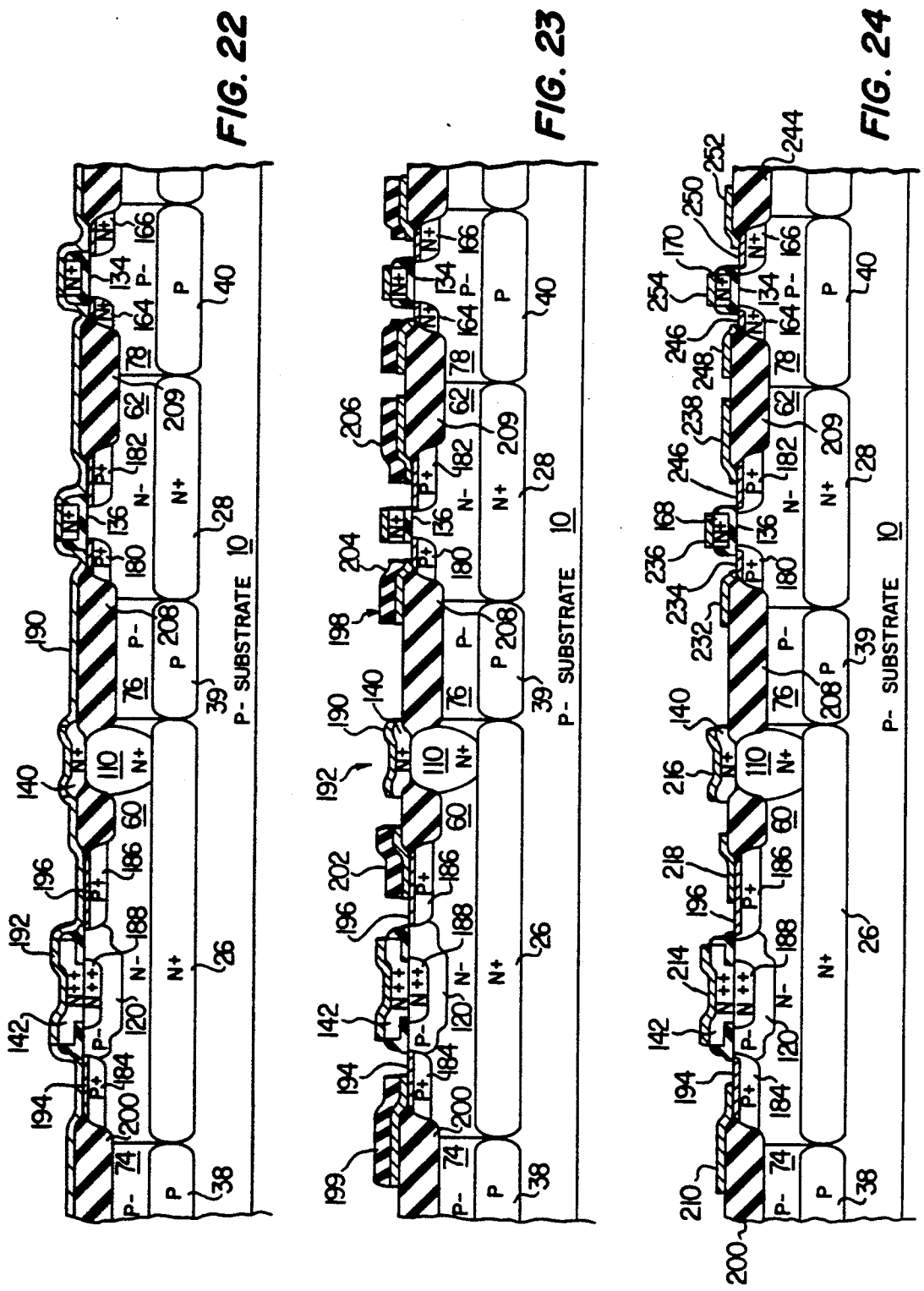

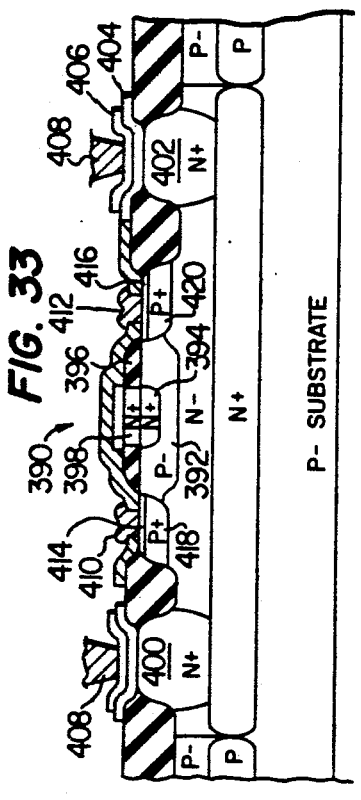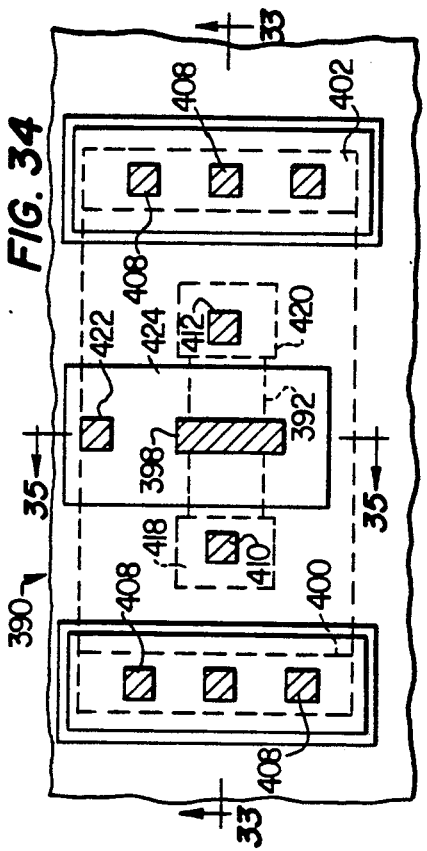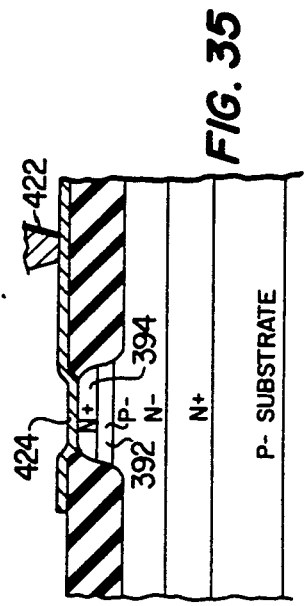
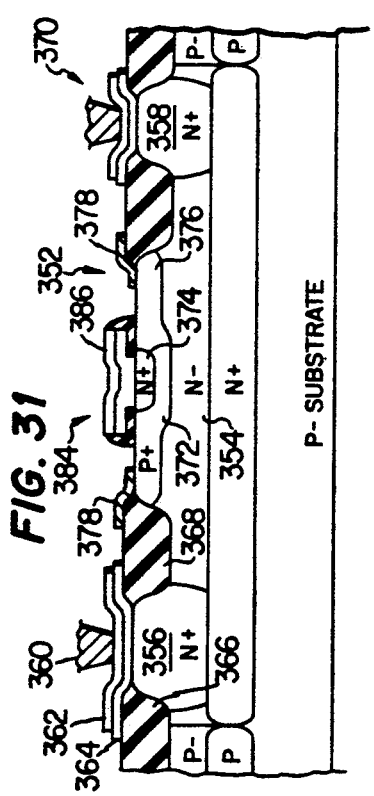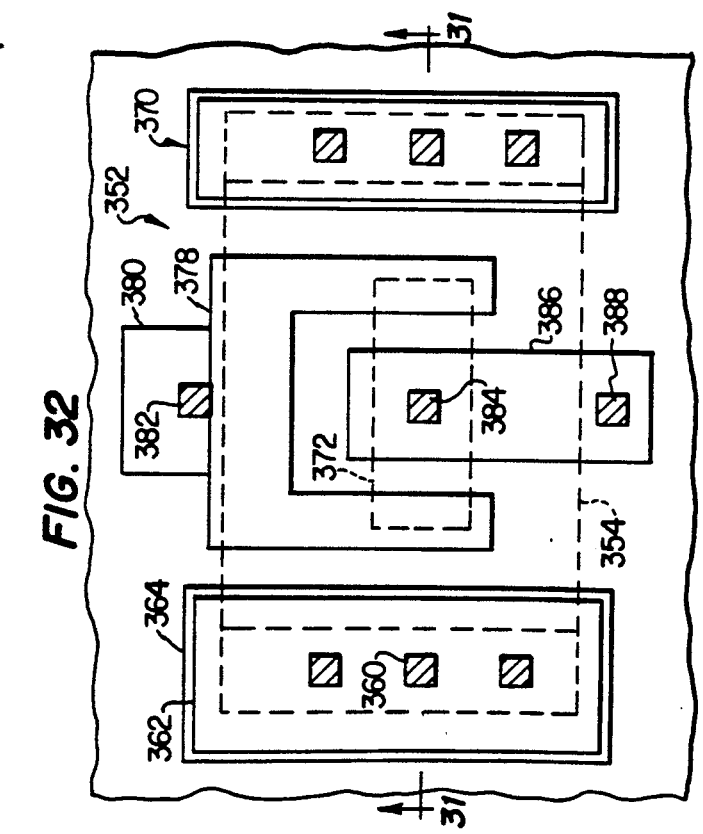

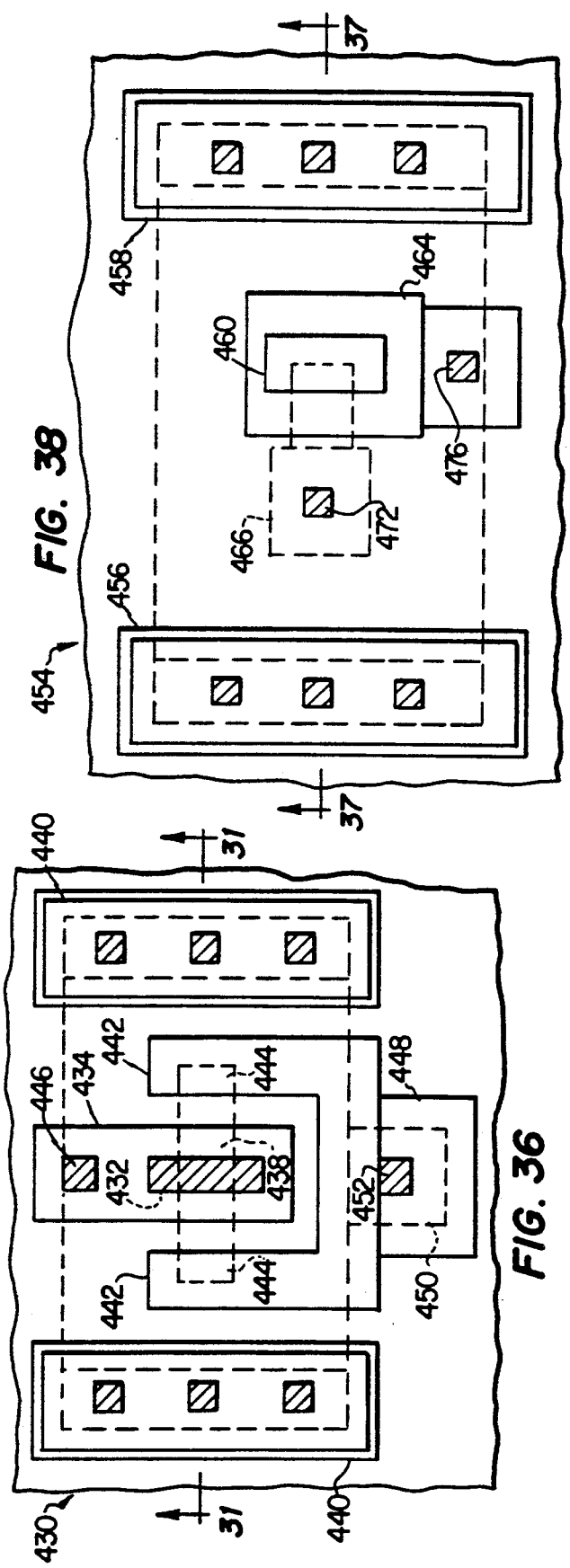
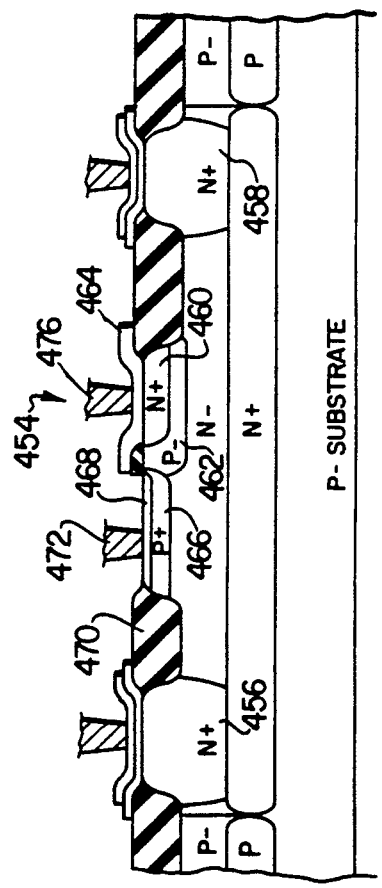
FIG. 38
FIG. 36
FIG. 37

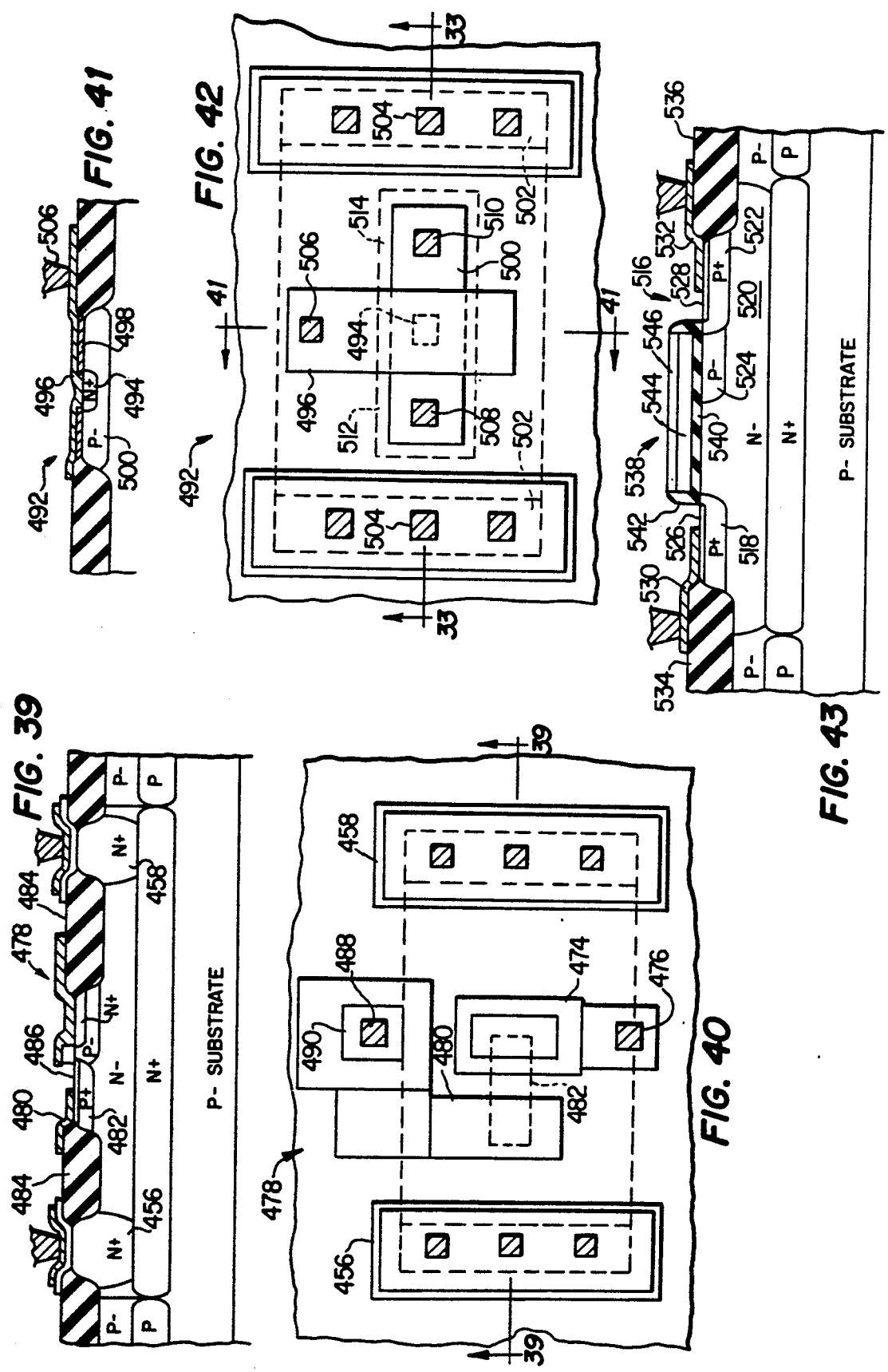

INTEGRATED BIPOLAR AND CMOS TRANSISTOR WITH TITANIUM NITRIDE INTERCONNECTIONS

RELATED APPLICATION

This application is a continuation of application Ser. No. 008,910, filed 01/30/87 now abandoned.

"Bipolar Transistor Fabrication utilizing CMOS Techinques", by David B. Spratt and Rajiv R. Shah, Ser. No 07/008,906, filed concurrently herewith.

TECHNICAL FIELD OF THE INVENTION

The present invention relates in general to semiconductor structures and the fabrication techniques associated therewith, and more particularly to the integration of bipolar and CMOS semiconductor process techniques.

BACKGROUND OF THE INVENTION

Field effect transistor (FET) technology is well suited for high density, low power circuits. Increased emphasis has also been placed on the FET technology for fabricating large scale integration circuits as such technology can provide complex logic functions and large memories with high yields. FET structures are fabricated using P-channel field effect transistors (PMOS) and N-channel transistors (NMOS). PMOS and NMOS transistor devices have been combined to form complementary metal oxide semiconductor (CMOS) circuits which provide improved performance over that of the individual devices.

As the degree of circuit complexity and integration increases, the speed of the FET circuits can become degraded due to capacitive loading. This is especially noticeable with FET output devices which must produce appreciable drive currents to other circuits. One approach for improving the drive capabilities of an FET device is to increase the width of its conduction channel. However, the shortcoming attendant with this approach is that the device requires more area, thereby hampering the ability to place a larger number of devices into a smaller area. Another approach for improving the speed characteristics of circuits using FET devices is to use bipolar transistors for the driving elements. Bipolar transistors are characterized by a high transconductance, thereby producing excellent drive capabilities for capacitive loads, thus ensuring high gain and fast signal rise times for the driving signals.

The integration of bipolar devices with FET devices to enhance the speed characteristics of a circuit is well known in the art. The traditional steps in fabricating the base, emitter and collector features of a bipolar transistor are different from the steps in fabricating the source, drain and gate features of a CMOS device. As a result, when it is desired to integrate a bipolar device with a CMOS circuit, separate fabrication steps are necessary to form the bipolar device and the CMOS device. Conventionally, there is minimal commonality between the bipolar and CMOS fabrication processes. It can be appreciated that with these approaches, the advantages of an integrated bipolar and CMOS device were realized, but at the cost of a more complicated fabrication process with many steps. When a semiconductor fabrication process is modified with additional steps, the yield of the resultant product can be expected to decrease.

While more recent developments have brought the processing of the bipolar devices and the CMOS devices into closer correspondence, there is a need for an improved bipolar/CMOS process which more fully integrates the process steps, as well as the devices. There is also a need for a bipolar transistor layout which is compatible with the design and fabrication of MOS transistor circuits.

SUMMARY OF THE INVENTION

In accordance with the present invention, a technique for fabricating integrated bipolar and CMOS devices is disclosed. The technique disclosed herein reduces or substantially eliminates the disadvantages and shortcomings associated with the prior art fabrication techniques. According to the invention, the fabrication steps for forming MOS transistors are made compatible and integrated with those of bipolar transistors, thereby simplifying the fabrication process.

In forming an exemplary integrated bipolar and CMOS device, adjacent N-type and P-type buried layers are formed in a semiconductor substrate. These buried layers define locations where overlying semiconductor tanks or wells will be formed. The N-type buried layer reduces the series collector resistance for a vertical NPN bipolar transistor. Also, the buried layers result in a decreased sublevel resistance, thereby significantly reducing latch-up between neighboring PMOS and NMOS transistors.

A thin epitaxial layer of semiconductor material is formed over the buried layers, and selectively implanted to form lightly doped P-type tanks over the P-type buried layers, and N-type tanks over the N buried layers. The thin epitaxial layer is patterned to define moat areas in which the bipolar, and the PMOS and NMOS transistors will be formed. The moat areas are isolated from each other by a channel stop implant and a thick field oxide. A thin layer of silicon dioxide, which comprises a gate oxide for the FET transistors, is formed on the moat areas. A thin layer of polycrystalline silicon, commonly termed polysilicon, is next deposited over the entire surface of the wafer. The substrate is masked and patterned so that the bipolar transistor base region can be implanted. Next, the thin gate oxide and the thin polysilicon layers are patterned to form an opening defining a polyemitter region in the bipolar moat. The opening in the composite silicon oxide and the polysilicon layer locate the emitter region for the NPN bipolar transistor within the implanted base region.

A thicker second layer of polysilicon is then deposited over the entire surface of the substrate, and implanted to heavily dope the polysilicon. This second polysilicon layer merges with the previously deposited polysilicon layer overlying the gate oxide. Also, in the bipolar moat areas, the second polysilicon layer contacts the P-base implanted silicon in the emitter contact opening. Where the thin oxide has been removed above the bipolar base region. This type of emitter is termed a nested polyemitter. The merged polysilicon layer is removed from those areas on the processed substrate, except for areas defining CMOS transistor gate conductors, and the bipolar polysilicon emitter region. The heavily doped thick polysilicon forms the gate conductors for the respective NMOS and PMOS transistors, and the polyemitter structure for the bipolar transistor. A layer of silicon oxide is next deposited over the entire surface of the processed wafer, and anisotropically etched to form an insulating sidewall oxide layer encircling the polysilicon gate and emitter structures. The wafer is then patterned to define the moat areas of the NMOS device, and implanted with an N-type impurity to form the source and drain regions.

Similarly, the wafer is patterned to define the moat areas of the PMOS and bipolar devices, and implanted with a P-type impurity, thereby forming the source and drain regions of the PMOS transistor. In this step a P-type base contact region is also formed around the bipolar moat circumscribing the polyemitter.

At this point, the exposed silicon and polysilicon are cleaned to remove any residue of oxide, except the polysilicon sidewall oxide. This is followed by a deposition of titanium over the wafer which is then reacted in a nitrogen ambient to form titanium silicide over regions where titanium is in contact with silicon, and to form titanium nitride elsewhere. The titanium nitride is patterned and etched to define local interconnect straps which will connect the final metallization to the titanium silicide moat regions of the MOS and the bipolar transistors. Conductive contact areas to certain MOS and bipolar transistors are formed over the field oxide regions instead of over the moat regions. Metal contacts are formed in contact with the patterned titanium nitride straps overlying the field oxide. The metal is thus indirectly connected to the titanium silicide moats and thus to the FET and bipolar transistors. The technical advantage of this technique is that small area transistors can be made, thus minimizing the resistances and capacitances associated with the FET and bipolar moat regions, and allowing for faster FET and bipolar transistors. The metallization pattern is formed through patterned openings in a passivating and insulating layer to the respective transistor electrodes.

The foregoing fabrication process can also be utilized to form a walled emitter structure for the bipolar transistor. In forming the walled emitter, the emitter polysilicon emitter is in contact with the transition region between the field oxide and the moat. The N++ emitter region extends between or overlaps the edge of the moat.

BRIEF DESCRIPTION OF THE DRAWINGS

Further features and advantages will become more apparent from the following and a more particular description of the preferred embodiment of the invention, as illustrated in the accompanying drawings in which like reference characters generally refer to the same elements, areas or regions throughout the views, and in which:

FIGS. 1–12 are sectional views of a wafer illustrating the isolation and formation steps defining the various semiconductor regions in which the bipolar and CMOS transistors are subsequently formed;

FIGS. 13–25 illustrate the integrated fabrication of the bipolar and CMOS transistors within the respective semiconductor regions;

FIGS. 31 and 32 are respective sectional and top views of another layout of an integrated bipolar structure having provisions for dual collector contacts to the bipolar transistor;

FIGS. 33–35 are sectional and top views of a small area walled emitter bipolar transistor having a symmetrical layout;

FIGS. 36 is a sectional view of a small area walled emitter bipolar transistor having a symmetrical layout with a bifurcated off-site base contact;

FIGS. 37 and 38 are respective sectional and top views of a small area bipolar transistor having a walled type of emitter, the layout being asymmetrical;

FIGS. 39 and 40 are respective sectional and top views of a walled emitter type of bipolar transistor, and with remote emitter and base connections of an asymmetrical layout;

FIGS. 41 and 42 are respective sectional and top views of a bipolar transistor having a nested type of emitter, with dual base and dual collector contacts; and FIG. 43 is a sectional view of a Lateral PNP bipolar transistor fabricated in accordance with the invention.

DETAILED DESCRIPTION OF THE INVENTION

Figure 25:
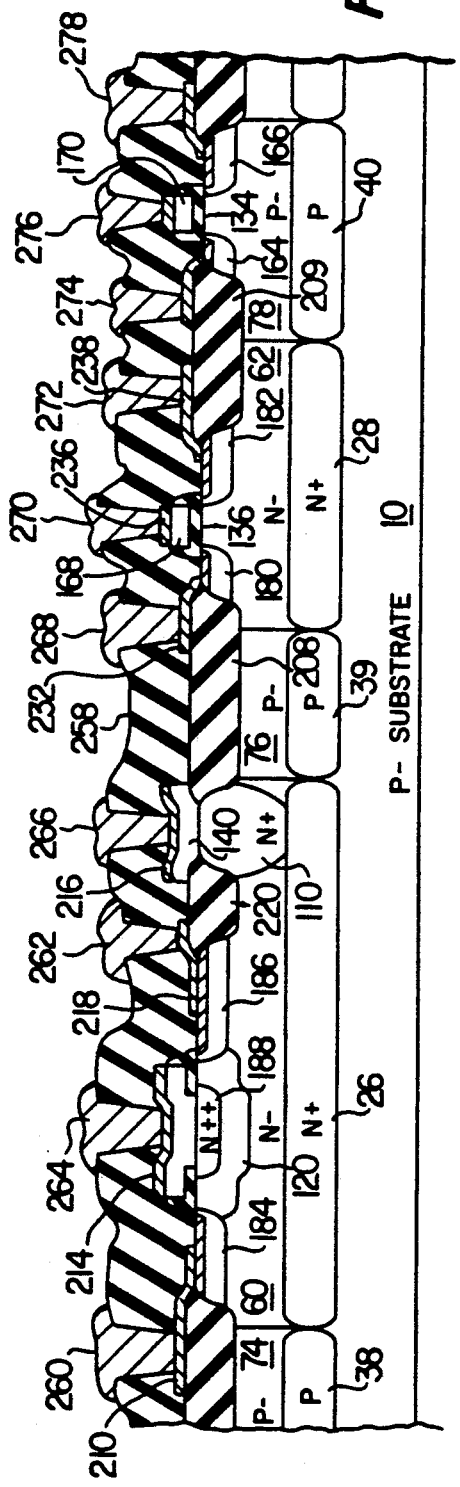

The following description details the integrated steps in fabricating a vertical NPN bipolar transistor, and a PMOS and NMOS transistor pair forming an integrated bipolar and CMOS structure. A lateral PNP bipolar transistor, and other transistors variations are also illustrated. The use of a bipolar transistor with a CMOS transistor pair is well-known in the art, and thus the particular interconnections therebetween to form a circuit will not be set forth. Those skilled in the art using the disclosure herein can readily and efficiently fabricate the integrated bipolar and CMOS transistors of the invention, and interconnect the electrodes thereof to form a circuit for carrying out a desired function. Also, the term "MOS" (metal oxide semiconductor) is used throughout this disclosure as a term of art to denote a general family of semiconductor devices, and not to the particular device which includes a metal gate conductor and an oxide insulator.

With reference now to FIG. 1 of the drawings, there is shown a P-type substrate 10 forming the base material on which a bipolar transistor and a CMOS transistor pair will be formed. The substrate 10 can be in the range of 6–10 ohm-centimeter or 40–60 ohm-centimeter P-type semiconductor material. Semiconductor substrate material of the <100> crystal latice orientation is preferable, but other orientations can be utilized. The substrate 10 is initially subjected to a wet oxygen ambient of about 900 degrees centigrade to form a layer 12 of silicon dioxide ($SiO_2$), or more commonly termed silicon oxide. The layer 12 is grown for a time sufficient to form about 500–600 angstroms of oxide.

A silicon nitride ($Si_3N_4$) layer 14 is deposited with a thickness of about 1300–1500 angstroms, overlying the silicon oxide layer 12. The silicon nitride layer 14 is deposited by a conventional low pressure chemical vapor deposition technique. A photoresist mask layer 16 is then spun or otherwise spread over the silicon nitride layer 14. The mask layer 16 is patterned to form areas 18 and 20 defining substrate locations in which N+ buried layers will be formed.

The photoresist material of the mask layer 16 is patterned by the removal thereof in the selected areas 18 and 20. The exposed silicon nitride layer 14 is etched by a well known plasma nitride etch process. After the nitride is removed from the selected areas 18 and 20, the exposed surface areas of the underlying silicon oxide 12 are cleaned to remove any remaining deposits or residue of the nitride layer 14 and the silicon oxide 12.

The wafer is then subjected to an ion implant, as noted by arrows 24 in FIG. 2, to form the N+ semiconductor areas 26 and 28. The ion implant 24 is driven through the thin silicon oxide layer 12, using antimony in the range of about $2-5 \times 10^{15}$ ions/cm$^2$. A peak antimony concentration of about $1.0 \times 10^{19}$ atoms/cm$^3$ is thus achieved. The ion implant 24 is made at about 40 Kev to achieve a desired implant depth. FIG. 2 illustrates the substrate 10 after the implant step to form the N+ buried layers 26 and 28. The substrate 10 is heated to a temperature exceeding 1100 degrees centigrade for about an hour to drive the impurity deeper into the substrate, and to heal crystal surface damage caused by the implant. The substrate 10 is heated for the noted time to form the N+ buried regions 26 and 28 having a depth of about 2.5 microns. The photoresist layer 16 can be removed or otherwise stripped during the fabrication steps so as not to be sujected to high temperatures.

FIG. 3 depicts a cross-sectional view of the substrate 10 after a surface portion of the N+ buried layers 26 and 28 has been oxidized to form the overlying thick layers 32 and 34 of silicon oxide. A layer of oxide grown to about 5,000-7,000 angstroms thick is preferable. The thick oxide formations 32 and 34 form a mask for a subsequent P-type impurity implant which forms corresponding P-type buried layer.

The silicon nitride layer 14 (FIG. 2) is removed, thus exposing the underlying silicon oxide layer 12. The thin silicon oxide layer 12 is removed by a deglazing operation in preparation for a subsequent P-type implant.

With reference to FIG. 4, a P-type impurity implant, shown as reference character 37, is driven into the surface of the P-substrate 10. The P-type implant 37 is conducted with a dosage of about $6-8 \times 10^{13}$ ions/cm$^2$, and energy of 60 Kev. Boron is employed as the impurity for ion implanting the substrate 10 to form the P-type buried layers 38, 39 and 40. While the boron ions have been driven into the substrate, the much thicker oxide regions 32 and 34 prevent the underlying N+ layers 26 and 28 from being affected by the P-type implant 37. The substrate 10 is again heated for about one half hour to a temperature of about 800-1,000 degrees C. to drive the boron ions into the substrate 10. A hydrofluoric solution is used to remove the thick oxide 32 and 34 from the surface of the substrate 10. As a result, the N+ regions 26 and 28 and the P layers 38-40 are exposed at the top surface of the substrate 10.

In FIG. 5, the next fabrication step according to the invention is the deposition of an epitaxial layer 44 of an N-type semiconductor material. The epitaxial layer 44 comprises the semiconductor material in which the tanks of the bipolar and the CMOS transistor will be formed. For high performance bipolar transistors, the epitaxial layer 44 is thin, preferably about 1.5 microns thick. A resistance of about 0.4-0.6 ohm-cm is adequate for forming high quality bipolar and CMOS transistors therein. Because of the high temperatures experienced in the epitaxial growth process, a certain degree of impurity up-diffusion will occur between the buried layers 26, 28 and 38-40 and the epitaxial layer 44.

A thin silicon oxide layer 46 is next grown over the surface of the epitaxial layer 44. In the preferred form of the invention, the silicon oxide layer 46 (FIG. 6) is in the range of about 400-600 angstroms thick. A silicon nitride layer 48 of about 1400 angstroms thick is next deposited by a low pressure chemical vapor deposition process over the oxide layer 46. Also, as shown in FIG. 6, a thick photoresist layer 50 is spun or otherwise spread over the surface of the nitride layer 48. The photoresist layer 50 is patterned and the exposed nitride is removed to define areas 52 and 54 in which underlying N-type tanks will be formed.

The processed substrate 10 is subjected to an N-type implant 58 which is effective to form plural tanks 60 and 62 in the corresponding areas 52 and 54 defined by openings in the photoresist mask 50. The tanks 60 and 62 are formed by the use of a phosphorus implant, conducted with an energy of about 80 Kev and a dosage of about $1.5-2.5 \times 10^{12}$ ions/cm$^2$. The N tank concentration is preferably about $2 \times 10^{16}$ ions/cm$^3$. The photoresist layer 50 is removed.

Continuing with the integrated bipolar and CMOS fabrication process, the semiconductor tanks 60 and 62 are oxidized to form thick oxide areas 66 and 68. The oxidation process is continued until about 4,000 angstroms of silicon oxide have been formed above the semiconductor tanks 60 and 62. The processed substrate 10 is annealed by heating to a high temperature to drive the impurity of the N-type tanks 60 and 62 deeper into the epitaxial layer 44. Crystal damage due to the ion implant is also healed during the annealing process FIG. 6 illustrates the semiconductor formed thus far according to the fabrication steps of the invention.

The remaining part of the silicon nitride layer 48 is removed, and the underlying thin oxide layer 46 is removed by a conventional deglazing technique. With reference to FIG. 7 of the drawings, the processed substrate 10 is subjected to an ion implantation 72, wherein a P-type impurity, such as boron, is implanted into the epitaxial layer 44. The P-type implant 72 is conducted at an energy of about 40 Kev, and dosage of about $5.5-6.5 \times 10^{12}$ ions/cm$^2$. P-type tanks 74, 76 and 78 are thus formed having a concentration of about $3 \times 10^{16}$ ions/cm$^3$. The processed substrate 10 is then heated for about an hour to a temperature of about 1,000-1,200 degrees centigrade to drive the P-type impurity deeper into the epitaxial layer 44. The thick oxide areas 66 and 68 are then removed by a hydrofluoric acid solution.

With the various annealing steps conducted on the processed substrate 10, the N-semiconductor tanks 60 and 62 and the P-semiconductor tanks 74-78 are merged with the underlying and more heavily doped buried layers 26, 28 and 38-40. The processing state of the substrate having the P— and N— semiconductor tanks is shown in FIG. 8. The processed substrate 10 is again oxidized, thereby forming a thin silicon oxide layer 80 over the top surfaces of the tanks. In addition, a silicon nitride layer 82 of about 1,400 angstroms thick is deposited by a LPCVD process over the thin oxide layer 80. Another photoresist layer 84, comprising the third mask of the process of the invention, is spread over the silicon nitride layer 82. The resist is patterned to form openings 86 above the PN semiconductor junctions formed between the P-type and N-type tanks. In addition, an opening 88 is formed in the photoresist layer 84 to define an area in the N— tank 60 for fabricating a deep collector associated the bipolar transistor. The thin silicon oxide layer 80 and the silicon nitride layer 82 are then plasma etched at those areas opened in the photoresist mask layer 84.

FIGS. 9–11 are enlarged views of the area adjacent the PN junction formed by buried P— layer 38 and N— layer 26. As shown in FIG. 9, semiconductor material from the P and N tanks 74 and 60 is also etched to a depth of about 900–1,100 angstroms. The exposed etched surface of the P and N tank material is cleaned, and ion implanted, if desired, to form channel stops within the respective tanks. For purposes of clarity, the channel stop is not shown. The processed substrate 10 is subjected to an oxidizing environment in which a thin layer 90 of silicon oxide is formed. The oxide layer 90 is about 200–300 angstroms thick. A thin layer 92 of LPCVD silicon nitride is also deposited over the entire surface of the substrate, over the thin oxide 90 at the bottom of the trench, and over the previously deposited and patterned silicon nitride layer 82 in the area surrounding the trench. Nitride layer 92 is deposited to a depth of about 400 angstroms.

A layer 94 of silicon oxide is then deposited over the nitride layer 92. The deposited oxide 94 is about 2,000 angstroms thick, and is deposited using tetraethylorthosilicate in a chemical vapor deposition process. FIG. 9 illustrates a cross-sectional view of one site of the substrate which has undergone the above-described process.

FIG. 10 illustrates the processed substrate 10 after having undergone an anisotropic etch which selectively removes material in the downward direction. The anisotropic etch removes the entire deposited oxide layer 94 and the second nitride layer 92. A wet oxide etch is effective to remove the thin silicon oxide layer 90 covering the bottom of the trench 87. The wet etch is not anisotropic in nature, and thus etches a portion of the silicon oxide layer 90 under the silicon nitride sidewall 96. The silicon nitride sidewall 96 is undercut where shown by numeral 98. The exposed area of the trench 87 is cleaned to remove any remaining residue and provide a clean surface, free of foreign material.

FIG. 11 illustrates the processed substrate 10 after the formation of a very thick field oxide 100 formed within the trench 87. The substrate 10 is subjected to an oxidizing environment until the exposed silicon tank material has been consumed sufficiently to form about 8,000 angstroms of oxide 100. The temperature of the substrate is elevated to about 900 degrees centigrade for a time sufficient to grow the 8,000 angstroms of silicon oxide 100. The silicon material underlying the oxide 80 is protected from the oxidation environment by the nitride layer 82, and thus does not form additional oxide.

The nitride layer 82 is stripped from the surface of the processed substrate 10 and a thin layer 102 of silicon oxide is grown over the surface of the semiconductor tanks, also shown in FIG. 11. A threshold adjust implant 104 is made over the entire surface of the substrate to establish a desired threshold voltage by which the NMOS and PMOS transistors can be turned on. The impurity implanted 104 can be boron with a dosage suitable to achieve the desired threshold voltage.

A photoresist mask layer 106 is spread over the surface of the processed substrate 10, and patterned to define a deep collector area 108. An N+ deep collector 110 is formed by implanting phosphorus through the opening 108 defined by the patterned photoresist mask 106. A phosphorus dosage of about $2-3 \times 10^{16}$ ions/cm$^2$, and a high energy level of about 100 Kev, is utilized to form the heavily doped collector 110 deep into the bipolar transistor tank 60. FIG. 12 illustrates the processed substrate after the formation of the deep collector 110. The photoresist layer 106 is stripped from the top surface of the substrate, as is the pre-gate silicon oxide layer 102.

The processed substrate 10 is again subjected to a silicon oxidation environment, wherein a 200 angstrom thick layer 111 is grown on the surface of the substrate. This is illustrated in FIG. 13 of the drawings. It can be seen that the gate oxide layer 111 covers the N-tank 60 in which the bipolar transistor will be formed, the N-tank 62 in which the PMOS transistor will be formed, and the P-tank 78 in which the NMOS transistor will be formed. Importantly, the oxide layer 111 forms the insulator between the CMOS transistor pair gate electrodes and the underlying transistor conduction channels. The thickness of the oxide layer 111 can be varied to provide further adjustment of the CMOS transistor thresholds.

In accordance with the principal feature of the invention, the emitter of the bipolar transistor is formed utilizing a split polysilicon deposition process, the details of which are described below. The polysilicon material used in forming the bipolar polyemitter is also deposited by the same process step which is used in forming the CMOS transistor pair gate electrodes. With reference to FIG. 13, a thin layer 112 of polycrystalline silicon is deposited over the entire surface of the substrate. A polysilicon depth of about 900–1,100 angstroms is preferable, although other polysilicon thicknesses can be used. A fifth photoresist mask layer 114 is spread over the wafer surface, and patterned to define an opening 116 for the bipolar transistor. The photoresist layer 114 is of sufficient thickness to provide a mask for a P-type impurity implant 118 in which boron ions are driven through the polysilicon layer 112 and the thin oxide layer 111 to form a semiconductor base region 120.

The base implant 118 is conducted with a boron dosage of about $1-2 \times 10^{14}$ ions/cm$^2$, and an energy level of about 60 Kev. As depicted in FIG. 13, the implant 118 forms a lateral base region 120 extending along the entire surface of the N-tank 60. The resist mask layer 114 is removed, and another layer 122 of photoresist, comprising the sixth mask of the invention, is spread over the surface of the substrate.

FIG. 14 shows the sixth photoresist mask 122 defining an intrinsic emitter opening 123 and a collector contact opening 124. The thin polysilicon layer 112 and the thin silicon oxide layer 111 are subjected to a dry chemical etch to remove these materials in the opened bipolar transistor area down to the implant <d surface 120. The various deposited layers of material underlying the photoresist mask layer 122 are not removed by the dry etch. The surface area of the exposed base interface area 125 is cleaned by a conventional piranha or RCA cleanup Also, the processed substrate 10 is annealed at a high temperature for several minutes to drive the bipolar transistor base implant 120 more deeply into the N-tank 60. After the anneal, the exposed surface of the semiconductor tank 60 is further cleaned to assure that no oxide residue remains on the surfaces. A 10% hydrofluoric deglazing solution is used to clean the top surface thereof.

A second thicker layer 126 of polycrystalline silicon is deposited by a conventional deposition process over the entire surface of the processed wafer. The second polysilicon layer 126 is about 4,000 angstroms thick, and merges with the previously deposited 1,000 angstrom thick first layer 112. FIG. 15 illustrates the second polycrystalline layer forming a composite layer 128 of polysilicon over both the NMOS gate oxide and the PMOS transistor gate oxide 111, and over the bipolar intrinsic polyemitter, the base interface area 125 and the collector 110. The polysilicon 128 is implanted 132 with a high dosage of an N-type impurity, such as phosphorus. The heavily doped polysilicon overlying the gate oxide 111, when patterned and etched, will form the gate conductors for the respective NMOS and PMOS transistors. The heavily doped polysilicon formed over the emitter/base interface 125 provides the diffusant for forming ar underlying emitter region within the base 120. Importantly, the doped polysilicon 128 is in physical and electrical contact with the base region 120 at the emitter/base interface 125. The polysilicon implant 132 is conducted, preferably at approximately 85 Kev with a concentration of $1.5-2.5 \times 10^{16}$ ions/cm$^3$.

A seventh photoresist mask layer 135 is spun over the surface of the processed wafer, and patterned, as shown in FIG. 16. The exposed polysilicon layer 128 is etched so that the polysilicon remains at locations overlying both the MOS transistor gate insulators 136 and 134, the bipolar transistor emitter/base interface 125, as well as over the deep collector 110. The polysilicon region 140 forms a portion of a collector electrode of the bipolar transistor. The heavily doped polysilicon emitter 142 only contacts the base region 120 within the interface 125, but overlaps somewhat over the gate oxide 111. The criticality of mask alignment forming such a nested emitter structure is thereby reduced. In forming a walled emitter structure, the photoresist mask 135 would be patterned over the bipolar transistor area with the resist edges more in vertical registry with the edges of the opening in the thin gate oxide layer 111.

The photoresist mask layer 135 is then stripped for subsequent wafer processing, as illustrated in FIG. 17. Continuing with the fabrication process of the invention, a conformal 2500 angstrom layer of silicon oxide 144 is deposited over the surface of the processed substrate. The conformal oxide layer 144 can comprise tetraethoxysilane deposited by conventional plasma techniques. It can be seen from the drawing of FIG. 17 that the deposited silicon oxide layer 144 merges with the gate oxide layer 111, and also with the MOS transistor oxides forming the respective gates insulators 134 and 136.

The conformal oxide layer 144 is anisotropically etched in the vertical direction, thereby resulting in the formations shown in FIG. 18. The anisotropic etch process is allowed to continue until about 2500 angstroms of silicon oxide have been removed, thereby leaving only the oxide deposited on the sidewalls of the MOS transistor gate polysilicon/oxide structures 146 and 148, as well as on the bipolar transistor emitter structure 150. The sidewall oxide 152 is particularly important in the NMOS transistor for forming the lightly doped drain type of structure to eliminate the hot electron effect. No deleterious effects of the sidewall oxide formations 154 and 156 occur with respect to the PMOS transistor and the bipolar transistor.

FIG. 19 illustrates a top view of the bipolar transistor annular emitter island 158. The base and emitter construction of the bipolar transistor can be constructed with other layouts which will be described in more detail below.

An eighth photoresist mask layer 162 is spread over the surface of the processed wafer, as shown in FIG. 20. This mask layer 162 is patterned to define source and drain openings in the NMOS transistor. An ion implant 165 is conducted to form heavily doped semiconductor regions 164 and 166 in the NMOS transistor. The semiconductor regions 164 and 166 form source and drain regions self aligned with respect to the gate structure 170. The N++ implant noted above is accomplished by using arsenic and/or phosphorus, at a dosage of about $5 \times 10^{15}$ ions/cm$^2$, and an energy level of 150 Kev. The photoresist layer 162 is then removed.

The processed wafer is next prepared for the formation of P-type impurity implants forming the P-channel MOS transistor regions, as well as the base contacts of the bipolar transistor. Referring to FIG. 21, a ninth photoresist mask 171 is spread over the surface of the processed substrate, and patterned to define openings for the source and drain regions 172 and 174 of the PMOS transistor, as well as contact area openings 176 and 178 in the base 120 of the bipolar transistor. The wafer is then implanted with boron to form the P+ MOS transistor source 180 and drain 182 regions. The semiconductor regions 180 and 182 form source and drain regions self aligned with respect to the gate structure 168.

The P+ boron implant also forms high concentration impurity regions 184 and 186 in the bipolar base region 120. While the P-type implanted bipolar regions are shown in cross-section as two regions, in actual practice the base contact is annular and surrounds the emitter island structure 158. The boron implant is conducted with a dosage of about $5 \times 10^{15}$ ions/cm$^2$, and at an energy level of about 30 Kev. The photoresist mask layer 171 is removed.

The processed wafer is then annealed for about 30-90 minutes at a temperature of about 900 degrees centigrade to drive the N+ impurity of the NMOS transistor source 164 and drain 166 regions further under the gate oxide 134. The P+ impurity of the source 180 and drain 182 regions of the PMOS transistor is also diffused further within the transistor tank 62, and extended laterally a short distance under the gate oxide 136. The P+ dopant regions 184 and 186 forming the extrinsic base contacts of the bipolar transistor is also diffused further downwardly. The N++ impurity of the emitter polysilicon 142 is driven into the underlying base region 120, thereby forming the emitter 188. The base region 120 defines a semiconductor moat of the bipolar transistor. As will be described in more detail below, the bipolar transistor constructed in accordance with the invention can be fabricated with moat areas which are smaller than bipolar transistors heretofore known. The substrate processed according to the foregoing steps is shown in FIG. 21. With one annealing step, the impurities of the various semiconductor regions are diffused and activated to form the proper semiconductor transistor elements.

The surface of the processed wafer is next cleaned with sulfuric acids and subsequently with hydrogen fluoride solutions. A 1,000 angstrom layer of titanium is deposited over the surface of the substrate. The titanium is next reacted by elevating the temperature of the processed substrate to about 675 degrees centigrade in an inert ambient of nitrogen for a time somewhat under an hour. Where the titanium interfaces with silicon, a conductive titanium silicide is formed. Where the titanium interfaces with a silicon oxide, such as the titanium overlying the field oxide regions, a conductive titanium nitride is formed. The surface of the substrate is cleaned by a diluted hydrochloric acid solution.

As shown in FIG. 22, titanium nitride (TiN) is shown in sectioned lines 190, while the titanium silicide TiSi$_2$ is shown crosshatched 192. As a result of the reaction of the P+ base contact areas 184 and 186 with the titanium, titanium silicide areas 194 and 196 are formed. Identical reactions are formed in the source and drain regions of the PMOS and NMOS transistors, thus forming corresponding lateral source and drain contact conductors.

A photoresist mask 198 is then spread over the reacted titanium layer, and patterned to form interconnections to the various terminals or conductors of the transistor devices. This is shown in FIG. 23, with the unmasked portions of the titanium nitride removed, such as by a suitable etch. Importantly, the patterned resist portion 199 is effective to define an underlying area for a contact to the bipolar transistor base 120. The contacts are defined to extend laterally from the transistor to a location overlying the thick field oxide 200. By this construction, a small area bipolar transistor can be fabricated without the concern of accommodating a number of closely-spaced electrodes and the attendant mask alignment problems. In the embodiment of FIG. 23, a second base contact area is defined by photoresist mask section 202. Similarly, the PMOS transistor can be made very small by defining a source conductor area by mask section 204, and a drain conductor area by mask section 206. Both mask sections 204 and 206 overlie a portion of the respective field oxide sites 208 and 209, thereby providing connections to the respective transistors at lateral outlying locations. The NMOS transistor is patterned in a comparable manner. The patterned photoresist is then removed.

As illustrated in FIG. 24, a first lateral base contact area 210, comprising titanium nitride, is formed in electrical contact with the semiconductor intrinsic base region 120 through both the heavily doped P+ extrinsic base region 184 and the overlying titanium silicide region 194. A buried emitter contact area 214, comprising conductive titanium silicide, is in electrical contact with the polysilicon conductor 142. The emitter polysilicon 142 and the titanium silicide 214 form a buried contact in electrical connection with the underlying semiconductor emitter active region 188. As noted above, the emitter region 188 is a heavily doped region formed by dopant from the polysilicon 142 diffused within the underlying intrinsic or active part of the base region 120. The bulk bipolar transistor action occurs between the emitter region 188, the intrinsic base region 120 underlying the emitter region 188, and the N− tank 60 and N+ deep collector 110. Contact from the deep collector 110 is made through the conductive polysilicon 140 to a titanium silicide strip 216. A second titanium nitride strip 218 forms a second lateral contact area, providing a second electrical connection to the intrinsic semiconductor base region 120. This contact is made through the P+ base contact region 186 and a titanium silicide interface 196.

The bipolar transistor is laterally isolated by thick surface field oxide layers 200 and 220. Subsurface substrate isolation of the bipolar transistor is provided by the P-tanks 74 and 76. The N− epitaxial collector region 60 is very thin, thereby providing a high performance bipolar transistor. The buried N+ sublayer 26 reduces the series collector resistance of the bipolar transistor to provide a low collector saturation voltage for the transistor. The N+ buried layer 26 also increases the latchup immunity with regard to neighboring transistors.

The PMOS and NMOS transistors are formed with layouts similar to that of the bipolar transistor. The PMOS transistor includes a lateral titanium nitride contact 232 partially overlying the thick field oxide 208, and in contact with a silicide interface source area 234. The source interface 234 is an electrical contact with the underlying semiconductor source region 180 of the PMOS transistor. A gate titanium silicide layer 236 is formed in electrical contact with the underlying conductive polysilicon 168. A voltage applied to the titanium silicide gate element 236 causes an electric field to be developed across the thin gate oxide 136, thereby forming an inversion or depletion region in the underlying N-moat 62. A conduction channel is thereby formed between the PMOS transistor source region 180 and the drain region 182. The transistor drain 182 is connected to a laterally extending titanium nitride contact 238 through an interface titanium silicide area 246. The laterally extending drain contact 238 partially overlies the thick field oxide 209. It should be noted that when viewed cross-sectionally, the construction of the PMOS transistor is similar to that of the bipolar transistor. Additional similarities of bipolar and CMOS transistor layouts are described below.

The NMOS transistor is formed in the face of the P-moat 78, between thick field oxide layers 209 and 244. The transistor source region 164 of the NMOS transistor is connected through a silicide interface 246 to a laterally extending titanium nitride conductor 248. Conductor 248 extends laterally from the NMOS transistor, partially overlying the thick field oxide 209. Electrical connection is made to the transistor drain 166 in a similar manner, e.g. through an intermediate silicide 250 to a laterally extending titanium nitride conductor 252 which overlies the thick field oxide layer 244. A voltage applied to the titanium silicide gate contact 254 is conducted through the polysilicon layer 170 and forms a conduction channel in the P-moat 78 under the gate oxide 134. Current can then flow from the source region 164 to the transistor drain region 166.

FIG. 25 is a cross-sectional view of an exemplary integrated bipolar and CMOS circuit complete with metallization and passivation layers. The passivating layer 258 comprises a thick layer of silicon oxide deposited over the surface of the substrate, and masked and patterned to form openings for the metal transistor contact electrodes. The bipolar transistor base electrodes 260 and 262 are formed by the conventional masking and patterning of a conductive metal which fills the openings in the passivation layer 258 and contacts the laterally extending base contacts 210 and 218. While not shown, the bipolar transistor base electrodes 260 and 262 are connected together by metallization (not shown) at another location on the top surface of the substrate. The emitter electrode 264 is formed through a corresponding opening in the passivating oxide 258, in contact with the underlying silicide buried emitter contact 214. In practice, the emitter electrode 264 may be laterally offset from the underlying buried emitter contact 214, and formed partially overlying the surrounding field oxide. In the embodiment shown in FIG. 25, the deep collector 110 area is formed laterally, and somewhat removed from the base and emitter regions. Contact to the deep collector 110 is made by the collector electrode 266 which is formed through an opening in the passivating oxide 258, in contact with the titanium silicide collector contact 216. The heavily doped polysilicon 140 provides an electrical connection between the deep collector region 110 and the titanium silicide contact 216.

It can be seen from the construction of the bipolar transistor that the various contact electrodes need not be closely spaced and in vertical registry with the underlying and small area regions of the bipolar transistor. Thus, registration or alignment of the various masks is simplified. Alignment of the base electrodes 260 and 262 with the underlying laterally extending contact strips 210 and 218 is also simplified in that a reliable connection can be made to any surface area on the respective strips. In the event that the mask which forms the openings within the passivating oxide layer 258 is slightly misadjusted, it can be seen that no adverse effects will result.

The electrical contact electrodes of the PMOS and NMOS transistors are similarly constructed by forming openings in the passivating oxide 258, and depositing a conformal metallic material thereover. Particularly, the PMOS transistor includes a source electrode 268 in contact with the laterally extending source contact strip 232. A gate electrode 270 contacts the gate polysilicon 168 through the titanium silicide 236. Electrical contact is made to the drain 182 of the PMOS transistor by electrode 272. The drain electrode 272 contacts the laterally extending drain contact strip 238 formed therebelow. Electrical connection is made to the NMOS transistor in a similar manner. The NMOS transistor includes a metallic source electrode 274, a gate electrode 276 and a drain electrode 278.

Figure 26:
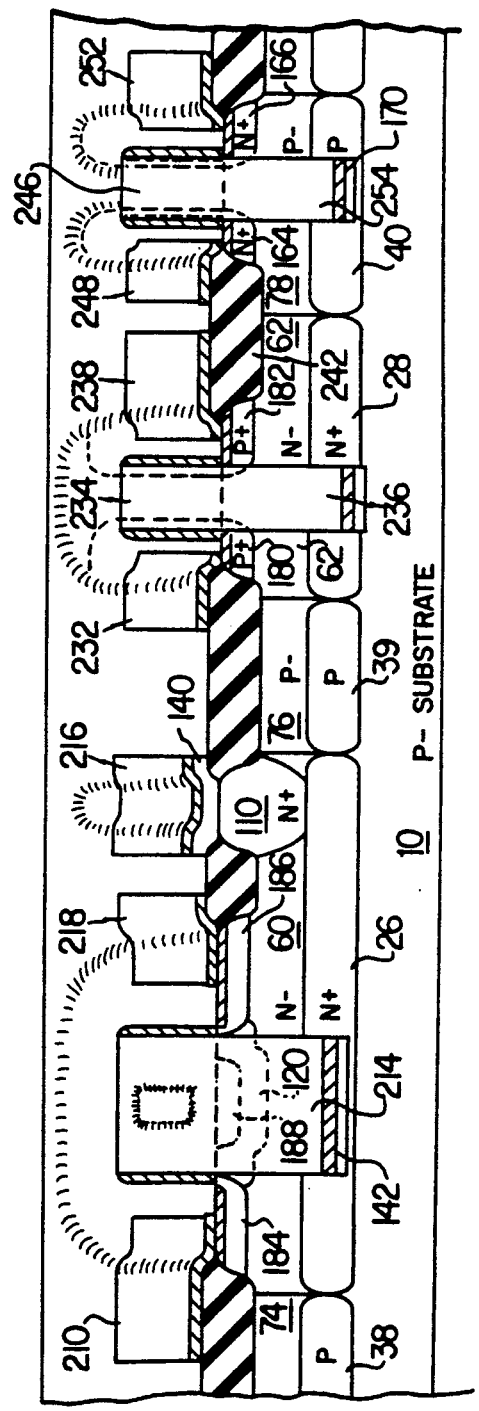
FIG. 26 is an oblique view of a sectioned semiconductor substrate, showing the layout and structure of the integrated bipolar and CMOS devices of FIG. 25.

FIG. 26 is an oblique sectional view of the integrated bipolar and CMOS structure fabricated in accordance with the foregoing steps. The passivating and metallizaton layers are omitted for clarity of the transistor features. This view further illustrates the layout similarities of the bipolar and CMOS devices.

Figure 27:
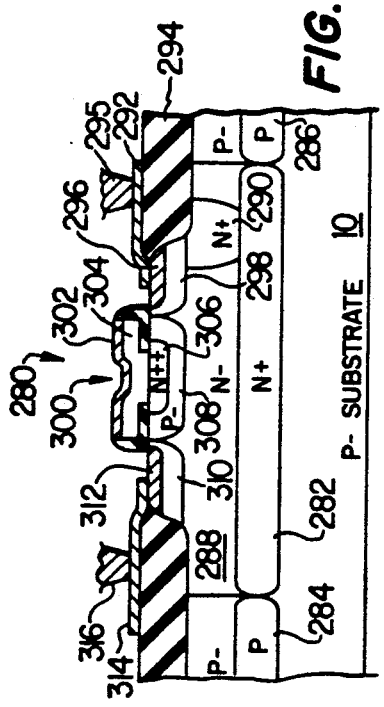
FIGS. 27 and 28 are respective sectional and top views illustrating alternative layouts of an integrated bipolar device with the collector formed adjacent the base and a nested emitter region.
Figure 28:
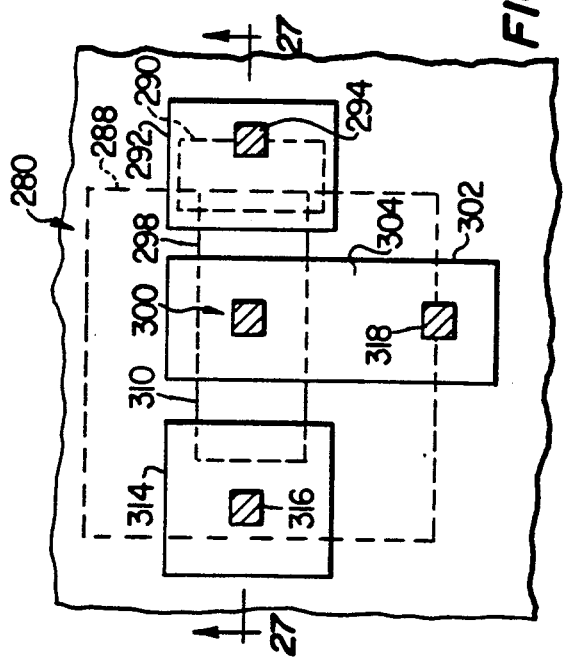

FIG. 27 illustrates another embodiment of a bipolar transistor 280 fabricated in accordance with the invention. Those skilled in the art may resort to the above disclosure to fabricate the transistor 280 having the cross-sectional configuration shown in FIG. 27, and a top view layout as shown in FIG. 28. The transistor 280 can be fabricated on the P-type substrate 10 with an N+ buried layer 282 formed between P-type sublayers 284 and 286. The bipolar transistor 280 is formed in a thin N-type epitaxial layer 288 forming the tank of the transistor. In this embodiment of the invention, the bipolar transistor 280 includes an N+ deep collector 290 with an associated contact conductor strip 292 extending laterally and overlying a thick field oxide 294. A metallic terminal electrode 295 is shown formed in contact with the laterally extending titanium nitride collector conductor 292. The conductor strip 292 is connected through a silicide interface layer 296 and an N+ semiconductor moat region 298 to the deep collector 290. A buried emitter contact 300 comprises a titanium silicide top layer 302, and a heavily doped polysilicon conductor 304 in contact with an underlying emitter region 306. The emitter region 306 is formed within a P-type intrinsic base region 308.

An extrinsic P+ base region 310 is formed intermediate the intrinsic base region 308 and a titanium silicide interface 312. The silicide 312 is formed as a result of the reaction of titanium with the P+ moat 310. As noted above, the titanium nitride strip 314 is also formed as a result of the reaction of titanium in a nitrogen atmosphere to form a titanium nitride conductor to which a metallic base electrode 316 is connected.

FIG. 28 illustrates a lateral extension of the emitter conductor 304 for providing a self-aligned electrical contact to the emitter structure of the transistor 280. Contact is made to the emitter 306 of the bipolar transistor 280 by a metallic electrode 318 which is formed in contact with the titanium silicide 302 overlying the polysilicon conductor 304. The laterally extending strip of titanium silicide 302 and polysilicon 304 make contact with the transistor emitter region 306 through the buried contact structure 300.

The layout of the bipolar transistor 280 of FIGS. 27 and 28 permit the deep collector 290 to be closely located to the intrinsic base region 308 and emitter 306. Using design rules having one micron minimum features and 0.75 micron minimum registration tolerance, this transistor layout requires only about 12.5 square microns of moat area. With the noted layout, one lateral extending conductor strip 314 provides connection to the transistor base 308, while an oppositely located and laterally extending conductor strip 292 provides a remote connection to the transistor collector 290. Moreover, connection is made to the emitter region 306 of the transistor 280 by the laterally, and forwardly extending, silicide strip 302. From FIG. 28, it is apparent that not only are common fabrication steps employed in forming the bipolar and CMOS transistors, but also the bipolar transistor 280 has a layout very similar to the MOS transistors of FIG. 26.

Figure 29:
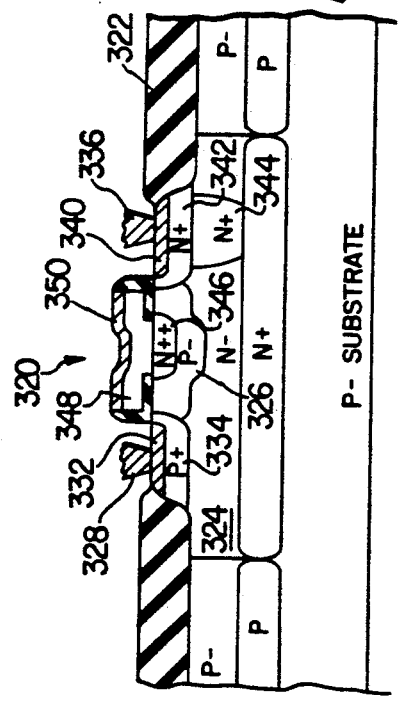
FIGS. 29 and 30 are respective sectional and top views of yet another layout of an integrated nested emitter bipolar structure having provisions for remote connection to the collection of the bipolar transistor.
Figure 30:
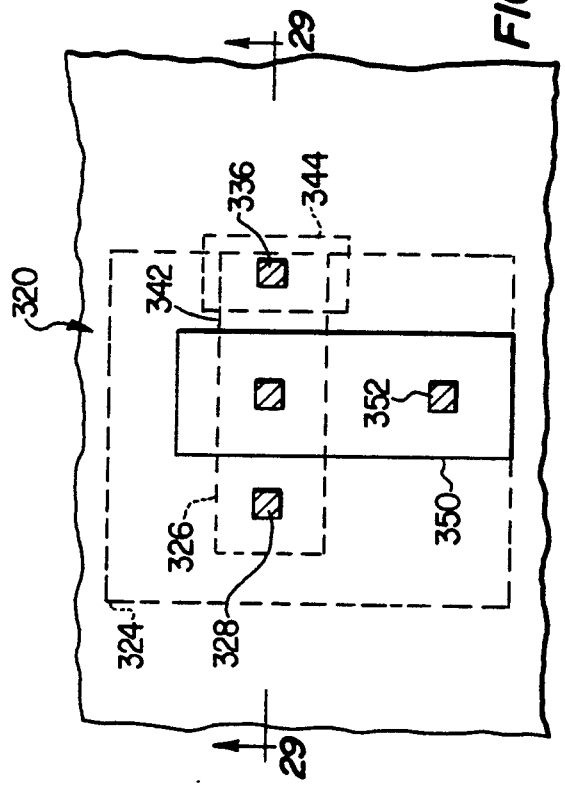

With reference to FIGS. 29 and 30, another layout of a bipolar transistor 320 is illustrated. With this layout, no conductor strips are formed extending in an overlying manner over the surrounding field oxide 322. The bipolar transistor 320 includes an N-type tank 324 in which is formed a P-type base moat 326. The base electrode 328 is formed in electrical contact with an intrinsic base 326 by a silicide interface 332 and a P+ region 334. The collector electrode 336 is also formed in contact with an underlying layer of silicide 340 and a heavily doped N+ region 342. The deep collector 344 is the region where bipolar transistor action occurs between the semiconductor emitter region 346 and the intrinsic base region 326. Again, electrical connection is made to the emitter region 346 by a composite strip of heavily doped polysilicon 348 and a silicide top layer 350. As shown in FIG. 30, an emitter electrode 352 provides a surface contact through the respective silicide and polysilicon layers 350 and 348 make contact to the emitter semiconductor region 346. Using the design rules noted above, a bipolar transistor moat constructed in accordance with this embodiment requires only about 15.62 square microns of moat area. In addition, this transistor layout minimizes the base and collector resistance, thereby improving the speed of the device.

A cross-sectional and top layout view of a double collector bipolar transistor 352 is shown in respective FIGS. 31 and 32. An epitaxial tank 354 has formed therein a first heavily doped N+ deep collector 356 and an oppositely located deep collector 358. One metallic collector electrode 360 is formed in contact with a titanium silicide layer 362 formed on an underlying heavily doped polysilicon conductor 364. The polysilicon conductor 364 contacts the heavily dope N+ deep collector region 356. The collector conductor layers 362 and 364 partially overlie field oxide regions 366 and 368, thereby providing a large lateral area for mask alignment to situate the metallic electrode 360 thereover.

The second collector contact structure 370 is similarly constructed.

The base of the bipolar transistor 352 includes an intrinsic base region 372 in which an emitter region 374 is formed. An extrinsic base region 376 extending laterally from the intrinsic region 372 appears at the face of the N-tank 354. A bifurcated titanium nitride conductor 378 is formed partially surrounding a silicide extrinsic base region 376. A titanium silicide strip 380, integral with the bifurcated section 378, extends over the surrounding field oxide and makes contact with the metallic base electrode 382. Electrode 382 comprises the base terminal of the bipolar transistor 352. As with the other embodiments described above, the emitter region 374 of transistor 352 includes a buried emitter contact 384 which is connected to a lateral extending silicide strip 386 which partially overlies a thick field oxide (not shown). A metallic emitter electrode 388 is formed in electrical contact with the lateral strip 386, thereby maintaining contact with the semiconductor emitter region 374. Using, the design rules set forth above, the bipolar transistor moat according to this feature requires only about 13.75 square microns of wafer area.

FIGS. 33, 34 and 35 illustrate yet another embodiment of a bipolar transistor 390 constructed in accordance with the principles and concepts of the invention. This embodiment is characterized by a small intrinsic base region 392 and thus improved transistor performance. With the noted design rules, a transistor moat with this layout requires only about 17 square microns of wafer area.

The transistor 390 depicted in FIGS. 33 and 34 is a symmetrical structure, of a walled emitter type. The walled structure of the N+ emitter region 394 is shown in cross section in FIG. 35. By a walled emitter structure, and as noted in FIGS. 33 and 35, the heavily doped polysilicon emitter 394 makes full contact with the intrinsic base region 392. No thin silicon oxide exists between the sidewall oxide 396 through which a portion of the polyemitter 398 is formed. Rather, the polyemitter 398 has a width substantially equal to the corresponding width of the emitter region 394, and is in full contact therewith. The emitter 394 can thus have a large area, whereas the transistor itself is yet characterized by a small area.

The walled emitter transistor 390 further includes symmetrical deep collector regions 400 and 402. Providing a collector contact interface to the deep collector regions 400 and 402 are doped polysilicon 404 and titanium silicide 406 layers. A metal electrode 408 is formed through a passivation layer opening (not shown) in electrical contact to the titanium silicide 406.

A pair of metal base contacts 410 and 412 make electrical contact with respective titanium silicide surface layers 414 and 416 overlying the extrinsic base regions 418 and 420.

As illustrated in FIG. 34, multiple electrodes 408 are employed to assure a low resistance contact to the respective deep collector regions 400 and 402. An off site emitter electrode 422 is shown in FIG. 35 connected to the polyemitter 398 through a titanium silicide/polysilicon strip 424.

FIG. 36 illustrates a walled emitter type of bipolar transistor 430, otherwise similar in construction to the nested emitter transistor 352 shown in FIGS. 31 and 32. Indeed, the cross-sectional view of the transistor 430 of FIG. 36 is substantially identical to that shown in FIG. 31. Transistor 430 includes a polyemitter 432 in contact with an overlying titanium silicide layer 434, and in contact with a heavily doped N+ semiconductor emitter region thereunder. As with the other walled emitter transistor described above, the full length and width of the polyemitter 432 is in contact with the underlying emitter region. The intrinsic base region is identified by numeral 438, and the deep collectors as 440. A bifurcated base contact 442 contacts the extrinsic base regions 444.

With reference to FIG. 36, the silicided polysilicon walled emitter extends laterally in one direction for contact to an off-site emitter electrode 446. The bifurcated base contacts 442 comprise titanium nitride which overlie the field oxide at location 448. A pad of polysilicon 450 underlies the titanium nitride, while a base metal eletrode 452 is formed in contact with the titanium strip 448.

When employing the design rules noted above, the transistor 430 requires a moat area of only about 8.25 square microns. The small moat region, comprising the intrinsic and extrinsic base regions 438 and 444, enables the transistor 430 to be fabricated in a small wafer area.

FIGS. 37 and 38 depict an NPN walled emitter transistor 454 having symmetrically arranged deep collectors 456 and 458. The walled emitter region 460 is formed in the intrinsic base region 462 by the diffusion of the impurities of the highly doped polysilicon emitter 464, as described in detail above. An extrinsic base 466 is formed in contact to the side of the intrinsic base 462. A titanium silicide 468 covers the extrinsic base 466. A base electrode 472 is formed in contact with the extrinsic base silicide 468. The material identified by reference character 464 is polysilicon. An emitter contact 476 is in electrical connection with the emitter 460 through the polysilicon 464.

A total moat area of about 8.88 square microns is utilized in fabricating the walled emitter transistor 454 of FIGS. 37 and 38. With such a small area, the parasitic elements are significantly reduced and thus the operation of the transistor is enhanced. Moreover, the packing density of the wafer is facilitated.

In FIGS. 39 and 40 then is depicted yet another type of walled emitter NPN transistor 478 constructed in accordance with the invention. This embodiment is similar to the transistor 454 described immediately above, but additionally includes a strap 480 of titanium nitride extending from an extrinsic base area 482 to a remote location overlying the field oxide 484 which surrounds the transistor 478. The top surface of the extrinsic base region 482 includes a silicide layer 486 which functions as an interface between the titanium nitride strap 480 and the extrinsic base region 482. The titanium nitride strap 480 is angled, as shown in FIG. 40, so as to be in general alignment with the emitter contact 476. A base contact electrode 488 is formed in contact with a pad of polysilicon 490.

When utilizing the design rules set forth above, the transistor moat can be fabricated using only about 4.5 square microns of wafer area.

The NPN transistor 492 of FIGS. 41 and 42 is similar to the transistor 390 of FIGS. 33 and 34, but is of the nested emitter type, rather than the walled emitter. As noted in FIG. 42, the cross section taken along Line 33 is substantially identical to that shown in FIG. 33. The nested structure of transistor 492 is illustrated in FIG. 41. Transistor 492 includes an emitter 494 formed by the diffusion of N-type impurities from a heavily doped polyemitter 496 through an opening in a thin silicon oxide 498 formed integral with a sidewall insulation (not shown). The technique for fabricating the nested emitter type of transistor is described in detail above. The emitter region 494 is small in area, and is diffused into a P-type intrinsic base region 500 A bipolar transistor having the layout illustrated in FIG. 42 occupies a moat area of only about 20 square microns.

The bipolar transistor 492 of FIG. 42 further includes deep collector regions 502, with collector electrodes 504 formed in contact therewith. An emitter electrode 506 is formed by a patterned metal layer formed in contact with the polysilicon emitter strip 496. The emitter electrode 506 contacts the emitter region 494 through the electrically conductive polysilicon strip 496. A pair of base contact electrodes 508 and 510 are connected through respective extrinsic base regions 512 and 514 to the intrinsic base region 500 which generally underlies the emitter region 494.

FIG. 43 is a sectional view of a Lateral PNP bipolar transistor, designated by reference numeral 516. The transistor 516 includes a P+ emitter region 518, an N-base region 520 and a P+ collector 522. For voltage breakdown purposes, a lightly doped P— region 524 is formed in contact with the heavily doped collector region 522, and between such collector and the emitter region 518. The emitter region 518 and the collector region 522 are formed in the face of the base tank 520, and are provided with respective silicide layers 526 and 528. When using titanium as a conductor material, such layers 526 and 528 comprise titanium silicide In addition, titanium nitride conductor strips 530 and 532 are shown formed in contact with silicide layers 526 and 528, and further are formed overlying the respective field oxide regions 534 and 536.

For contacting the transistor base region 520, a polycrystalline silicon and silicide structure 538 is provided. The contact structure 538 is similar in construction as the buried emitter structure described above. Particularly, the PNP transistor base contact structure 538 includes a silicon oxide interface 540, with sidewalls 542 within which are formed a polycrystalline strip 544 and a top titanium silicide surface 546. While not shown, the conductive polycrystalline silicon 544 makes contact with the semiconductor base region 520 through an opening in the thin silicon oxide layer 540. The transistor 516 can be fabricated by the same process steps as described above in connection with FIGS. 1-25.

TECHNICAL ADVANTAGES OF THE INVENTION

From the foregoing, an integrated bipolar and CMOS fabrication process is disclosed. The fabrication costs are reduced and the yields of the semiconductor structures formed according to the invention are significantly increased. This is due in a large part to a reduction of process steps in fabricating the bipolar and the MOS transistors. Various mask steps can be combined to simultaneously form bipolar and MOS semiconductor regions and features.

A split polysilicon process enables the bipolar transistor emitter and a MOS transistor gate structure to be formed in the same process steps. Both nested and walled emitter structures for bipolar transistors are available with this process. The polysilicon depositions which form the MOS transistor gate conductors and the bipolar transistor emitter is implanted with an impurity which, for the MOS transistors forms highly conductive gate electrodes, and for the bipolar transistor forms a high concentration impurity emitter element. The highly doped polysilicon emitter element is later diffused into an intrinsic base region to form the bipolar emitter region. A subsequently formed polysilicon layer completes the emitter and gate structures of the respective bipolar and MOS transistors.

Mask alignment constraints are eased in the fabrication steps of the invention by forming conductor straps laterally extending from the transistor regions to locations partially overlying the field oxide. In this manner, the criticality of the vertical registry of metallization contact patterns is reduced. In addition, the transistor features themselves can be reduced to the submicron level, without also requiring increased alignment of contacts to the smaller transistor regions.

Further advantages in circuit operation are realized by forming the bipolar and MOS transistors in a thin epitaxial layer with buried N+ and P wells and shallow N— and P— twin wells. With this type of semiconductor structure the operational characteristics of the bipolar transistor are enhanced and latch-up immunity of adjacent transistors is improved. With regard to the operational characteristics, the bipolar transistor series collector resistance is reduced.

While the foregoing discloses the preferred embodiment of the invention, it is to be understood that many changes in the detail may be made as a matter of engineering choices without departing from the spirit and scope of the invention as defined by the appended claims. Moreover, those skilled in the art may find that it is not necessary to adopt all of the various advantages and features of the present disclosure into a single integrated circuit in order to realize the individual advantages disclosed herein.

What is claimed is:

1. A small area bipolar transistor, comprising:
   a semiconductor tank formed in a face of a semiconductor body, said tank forming a collector region of said transistor;
   a semiconductor moat formed in said tank, said most forming an active intrinsic base region of said transistor;
   an emitter region formed in said base region;
   an extrinsic base region formed in said moat; and
   a metal nitride contact directly connected to a silicide on said extrinsic base, said nitride contact extending laterally beyond said tank.

2. The bipolar transistor of claim 1 further including a heavily doped deep collector forming in said tank.

3. The bipolar transistor of claim 1 wherein said moat has a surface area no larger than about sixteen square microns.

4. The bipolar transistor of claim 1 further including a layer of insulating material overlying said base region for aligning said emitter region thereto.

5. The bipolar transistor of claim 1 wherein said contact means contacting said emitter region comprises a conductive strip extending over said emitter region and over said tank, and including an electrode formed in contact with that part of said conductive strip overlying said tank.

6. The bipolar transistor of claim 1 wherein said contact means contacting said base region makes plural connections to said base region.

7. The bipolar transistor of claim 6 wherein said contact means contacting said base region is bifurcated and is formed partially around said contact means contacting said emitter region.

8. The bipolar transistor of claim 7 wherein said emitter region comprises a nested structure having a thin layer of silicon oxide overlying said base region, said oxide having an aperture therein for forming said emitter region.

9. The bipolar transistor of claim 8 wherein said moat includes a surface area no larger than about fourteen square microns.

10. The bipolar transistor of claim 7 wherein said emitter region comprises a walled structure having a layer of doped polycrystalline silicon overlying said moat, and said emitter region is formed in that part of said moat which underlies said doped polycrystalline silicon.

11. The bipolar transistor of claim 10 wherein said moat includes a surface area no larger than about nine square microns.

12. The bipolar transistor of claim 1 wherein said moat is formed rectangular shaped in a face of said tank, and said emitter region is formed rectangular shaped in a face of said moat, said moat and said emitter region being formed so that the longer dimensions thereof are orthoginal.

13. The bipolar transistor of claim 12 wherein said moat includes a surface area no larger than about seventeen square microns.

14. The bipolar transistor of claim 12 wherein said moat includes a surface area no larger than about nine square microns.

15. The bipolar transistor of claim 12 wherein said means for contacting said moat makes contact thereto on opposing lateral sides of said emitter region.

16. The bipolar transistor of claim 1 wherein said moat is formed rectangular shaped in a face of said tank, and wherein said emitter region is formed in one end of said moat, and said means for contacting said base region makes contact at an opposing end of said moat.

17. The bipolar transistor of claim 16 wherein said moat includes a surface area no larger than about nine square microns.

18. A small area bipolar transistor, comprising:

a semiconductor tank formed in a face of a semiconductor body, said tank forming a collector region of said transistor;

a rectangular shaped semiconductor moat formed in a face of said tank, said moat being no more than about five square microns and forming an active intrinsic base region of said transistor;

said moat defining a first section and a second section, and further including an emitter region formed in said first section and an extrinsic base formed in said second section;

a metal silicide disposed on said extrinsic base region; and a metal nitride contact directly connected to said metal silicide, said contact extending laterally beyond said tank.

19. The bipolar transistor of claim 18 further comprising a emitter contact means which comprises a strip of doped polycrystalline silicon in contact with said emitter region and extending laterally over said tank, and further including an electrode formed in electrical contact with said polycrystalline silicon and disposed over said tank.

20. The bipolar transistor of claim 18 wherein said metal nitride contact means comprises an elongate electrical conductor extending from a location overlying said base region laterally outwardly over said tank, and further including a base electrode in contact with that part of said base contact means which is remote from said base region.

21. The bipolar transistor of claim 20 further including a field insulation formed around said tank, and wherein said base contact means overlies said field insulation, and said base electrode is formed in electrical contact with said base contact means in a location overlying said field insulation.

22. The bipolar transistor of claim 18 further including a plurality of deep collector regions formed in said tank.

23. The bipolar transistor of claim 18 wherein said base contact means comprises titanium nitride.

* * * * *